US011532366B2

(12) United States Patent
Park et al.

(10) Patent No.: US 11,532,366 B2
(45) Date of Patent: Dec. 20, 2022

(54) STORAGE DEVICES AND METHODS OF OPERATING STORAGE DEVICES

(71) Applicant: SAMSUNG ELECTRONICS CO., LTD., Suwon-si (KR)

(72) Inventors: Jiwoon Park, Suwon-si (KR); Jaehyurk Choi, Jeonju-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 12 days.

(21) Appl. No.: 17/201,761

(22) Filed: Mar. 15, 2021

(65) Prior Publication Data

US 2022/0051733 A1 Feb. 17, 2022

(30) Foreign Application Priority Data

Aug. 11, 2020 (KR) ........................ 10-2020-0100259

(51) Int. Cl.
*G11C 16/32* (2006.01)
*G06F 3/06* (2006.01)
(Continued)

(52) U.S. Cl.
CPC ............ *G11C 16/32* (2013.01); *G06F 3/0604* (2013.01); *G06F 3/0659* (2013.01); *G06F 3/0679* (2013.01); *G11C 16/0483* (2013.01); *G11C 16/10* (2013.01); *G11C 16/26* (2013.01); *H03L 7/0812* (2013.01); *H03L 7/0891* (2013.01); *H01L 25/0657* (2013.01)

(58) Field of Classification Search
CPC ..... G11C 16/32; G11C 16/0483; G11C 16/10; G11C 16/26; G11C 29/42; G11C 5/145; G11C 7/12; G11C 8/08; G11C 13/1689; G11C 7/1072; G11C 11/4076; G06F 3/0604; G06F 3/0659; G06F 3/0679; G06F 13/4234; G06F 13/1689; G06F 1/10; G06F 13/4239; H03L 7/0812; H03L 7/0891; H01L 25/0657
(Continued)

(56) References Cited

U.S. PATENT DOCUMENTS 5,196,733 A 3/1993 Shin
7,728,638 B2 6/2010 Varricchione
(Continued)

FOREIGN PATENT DOCUMENTS

| KR | 10-1993-0008655 B1 | 2/1993 |
| KR | 10-1871234 B1 | 8/2018 |
| WO | 2012009318 A1 | 1/2012 |

OTHER PUBLICATIONS

Communication dated Oct. 28, 2021 issued by the European Patent Office in European Application No. 21171041.3.

*Primary Examiner* — Fernando Hidalgo
(74) *Attorney, Agent, or Firm* — Sughrue Mion, PLLC

(57) ABSTRACT

A storage device includes a semiconductor memory device and a storage controller. The semiconductor memory device receives write data based on a data strobe signal and data signals, and outputs read data based on the data strobe signal and the data signals. The storage controller transmits the data strobe signal and the data signals in parallel to the semiconductor memory device through signal lines. The storage controller includes a first delay circuit that delays the data signals such that some edges of windows of the data signals on the signal lines are desynchronized by first skew offsets which are different from one another.

20 Claims, 21 Drawing Sheets

(51) Int. Cl.
   *G11C 16/04*   (2006.01)
   *G11C 16/10*   (2006.01)
   *G11C 16/26*   (2006.01)
   *H03L 7/081*   (2006.01)
   *H03L 7/089*   (2006.01)
   *H01L 25/065*  (2006.01)

(58) Field of Classification Search
   USPC ......................................................... 711/103
   See application file for complete search history.

(56)  References Cited

U.S. PATENT DOCUMENTS

| | | | |
|---|---|---|---|
| 9,462,405 B2 | 10/2016 | Lee | |
| 10,103,718 B1 | 10/2018 | Swanson et al. | |
| 10,229,081 B2 | 3/2019 | Berke et al. | |
| 10,403,375 B2 | 9/2019 | Lee et al. | |
| 11,120,863 B2* | 9/2021 | Aquil | G11C 11/4076 |
| 11,217,285 B1* | 1/2022 | Jeter | G11C 7/22 |
| 11,341,067 B2* | 5/2022 | Best | G11C 11/4076 |
| 2012/0051171 A1* | 3/2012 | Swanson | G11C 8/18 |
| | | | 365/233.1 |
| 2018/0366168 A1 | 12/2018 | Naruse | |
| 2019/0354431 A1 | 11/2019 | Lee et al. | |
| 2019/0362764 A1 | 11/2019 | Qawami et al. | |
| 2020/0012332 A1 | 1/2020 | Ware et al. | |
| 2020/0059226 A1 | 2/2020 | Choi et al. | |
| 2020/0285406 A1* | 9/2020 | Notani | G11C 11/4074 |
| 2021/0304808 A1* | 9/2021 | Penney | G11C 11/4091 |
| 2021/0319818 A1* | 10/2021 | Shin | G11C 8/18 |

* cited by examiner

| DQ | OFS1 |
|---|---|
| DQ1 | 0 |
| DQ2 | +a |
| DQ3 | +b |
| ⋮ | ⋮ |
| DQm | +p |

| DQ | OFS2 |
|---|---|
| DQ1 | 0 |
| DQ2 | −a |
| DQ3 | −b |
| ⋮ | ⋮ |
| DQm | −p |

STORAGE DEVICES AND METHODS OF OPERATING STORAGE DEVICES

CROSS-REFERENCE TO RELATED APPLICATION

This application claims priority under 35 USC § 119 to Korean Patent Application No. 10-2020-0100259, filed on Aug. 11, 2020, in the Korean Intellectual Property Office (KIPO), the disclosure of which is incorporated by reference herein in its entirety.

BACKGROUND

1. Technical Field

Example embodiments relate generally to storage, and more particularly to storage devices and methods of operating storage devices.

2. Discussion of the Related Art

Storage devices are devices for storing data according to control of host devices such as a computer, a smart phone, and/or a smart pad. The storage devices include a device for storing data on a magnetic disk, such as a hard disk drive (HDD), and a device for storing data on a semiconductor memory, such as a solid state drive (SSD) and a memory card, that is, a non-volatile memory.

Use of a storage device including a non-volatile memory is expanding from personal computers to business computers such as a data server. With the expansion of use of a storage device, various functions and form factors of storage devices are required in individual fields. A storage device is connected to various hosts and transmits high-frequency signals to a host, and thus a signal characteristic output from the storage device is to be enhanced.

SUMMARY

It is an aspect to provide a storage device capable of reducing crosstalk occurring between a storage controller and a storage which exchange data signals in parallel.

It is another aspect to provide a method of operating a storage device, capable of reducing crosstalk occurring between a storage controller and a storage which exchange data signals in parallel.

According to an aspect of one or more example embodiments, there is provided a storage device that includes a storage controller and at least one semiconductor memory device. The at least one semiconductor memory device receives write data based on a data strobe signal and a plurality of data signals, and outputs read data based on the data strobe signal and the data signals. The storage controller transmits the data strobe signal and the data signals in parallel to the at least one semiconductor memory device through a plurality of signal lines. The storage controller includes a first delay circuit and the first delays the data signals such that at least some edges of windows of the data signals on the signal lines are desynchronized by first skew offsets which are different from one another.

According to another aspect of one or more example embodiments, there is provided a method of operating a storage device which includes a storage controller and at least one semiconductor memory device, the storage controller configured to control the at least one semiconductor memory device. The method may include performing, by the storage controller, training to search for first skew offsets for minimizing crosstalk occurring among signal lines while transmitting training patterns to the at least one semiconductor memory device through the signal lines; storing, by the storage controller, the first skew offsets in a register therein as skew information based on a result of the training; transmitting, by the storage controller, the skew information to the at least one semiconductor memory device, delaying, by a first delay circuit of the storage controller, data signals such that at least some first edges of the data signals are desynchronized by the first skew offsets; transmitting, by the storage controller, the delayed data signals and a data strobe signal to the at least one semiconductor memory device through the signal lines; and delaying, by a second delay circuit of the at least one semiconductor memory device, the data signals by second skew offsets based on the skew information to cancel the first skew offsets to provide original data signals.

According to yet another aspect of one or more example embodiments, there is provided a storage device that includes a storage controller and at least one nonvolatile memory device. The at least one nonvolatile memory device is configured to receive write data based on a data strobe signal and a plurality of data signals, and configured to output read data based on the data strobe signal and the plurality of data signals; and the storage controller is configured to transmit the data strobe signal and the plurality of data signals in parallel to the at least one nonvolatile memory device through a plurality of signal lines, wherein each of the plurality of data signals has a window defined by a first edge and a second edge; the storage controller includes a first delay circuit configured to delay the plurality of data signals such that at least some edges of the plurality of data signals are desynchronized by first skew offsets which are different from one another; the storage controller is configured to transmit skew information including the first skew offsets to the at least one nonvolatile memory device; and the at least one nonvolatile memory device includes a second delay circuit configured to receive the skew information, and configured to delay the plurality of data signals by second skew offsets based on the skew information to cancel the first skew offsets to provide original data signals.

BRIEF DESCRIPTION OF THE DRAWINGS

Illustrative, non-limiting example embodiments will be more clearly understood from the following detailed description in conjunction with the accompanying drawings, in which:

FIG. 9 illustrates an example of a first register of the nonvolatile memory device of FIG. 8;

FIG. 10 illustrates an example of the first register of the nonvolatile memory device of FIG. 8;

DETAILED DESCRIPTION OF THE EMBODIMENTS

Various example embodiments will be described more fully hereinafter with reference to the accompanying drawings, in which some example embodiments are shown.

According to various example embodiments, a storage controller including a delay circuit delays data signals to be transmitted to a semiconductor memory device through signal lines such that at least some of first edges of the data signals are desynchronized by skew offsets, and transmits the data signals to the semiconductor memory device. The semiconductor memory device receives skew information associated with the skew offset, and aligns the data signals by cancelling the skew offsets based on the skew information. Therefore, the storage device may increase signal integrity and enhance performance by reducing crosstalk occurring in the data signals on the signal lines.

Figure 1:
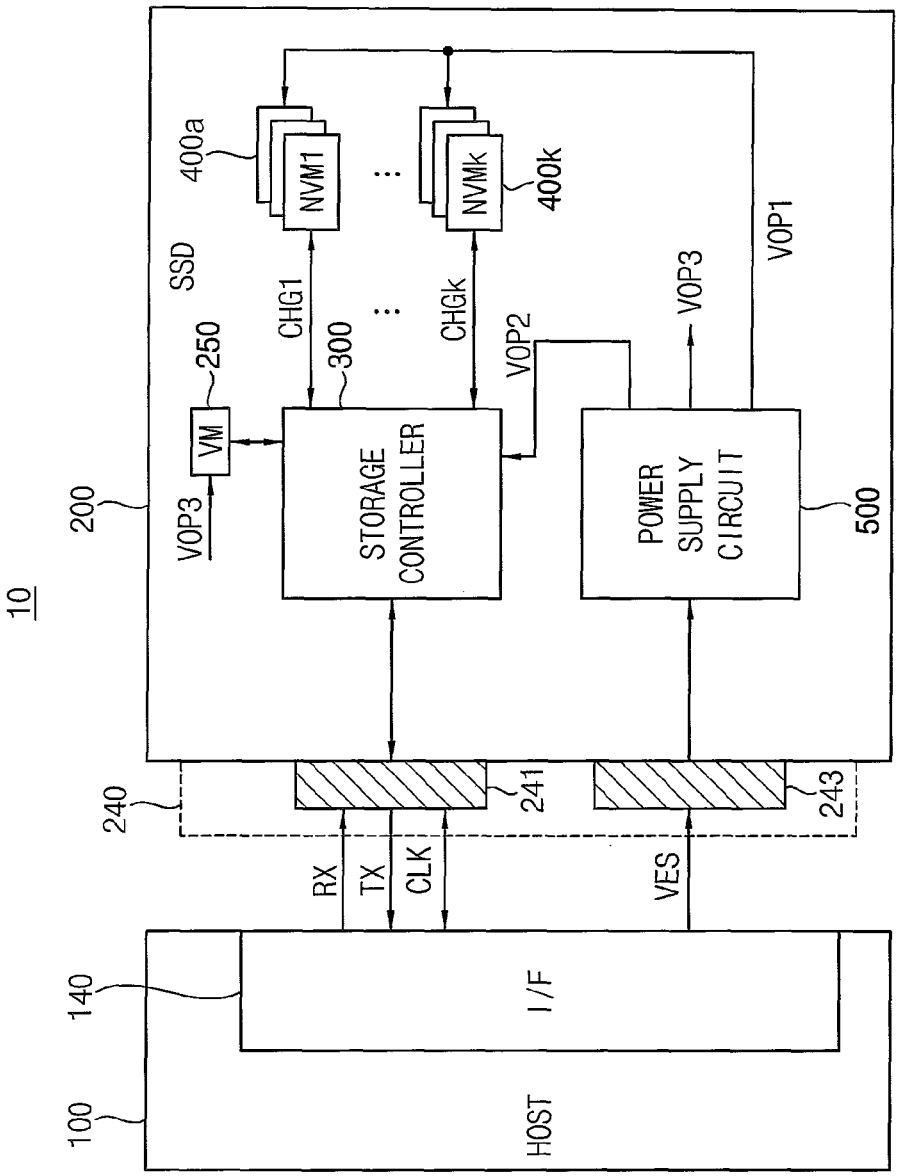
FIG. 1 is a block diagram illustrating a storage system according to example embodiments.

FIG. 1 is a block diagram illustrating a storage system according to example embodiments.

Referring to FIG. 1, a storage system 10 may include a host 100 and a storage device 200. The host 100 may include a storage interface (I/F) 140.

In FIG. 1, the storage device 200 is illustrated as a solid state drive (SSD) device as an example. However, example embodiments are not limited thereto. According to some example embodiments, the storage device 200 may be any kind of storage device.

The storage device 200 may include a storage controller 300, a plurality of nonvolatile memory devices (NVM) 400a~400k (where k is an integer greater than two), a power supply circuit 500 and a connector 240. The connector 240 may include a signal connector 241 and a power connector 243. The storage device 200 may further include a volatile memory device (VM) 250. The plurality of nonvolatile memory devices (NVM) 400a~400k and the volatile memory device (VM) 250 may be referred to as semiconductor memory devices.

The plurality of nonvolatile memory devices 400a~400k may be used as a storage medium of the storage device 200. In some example embodiments, each of the plurality of nonvolatile memory devices 400a~400k may include a flash memory or a vertical NAND memory device. The storage controller 300 may be coupled to the plurality of nonvolatile memory devices 400a~400k through a plurality of channels CHGI~CHGk, respectively.

The storage controller 300 may receive a reception signal RX from the host 100 may transmit a transmission signal TX to the host 100, and may exchange a clock signal CLK with the host 100 through the signal connector 241. The reception signal RX may include a command signal, an address signal and a data.

The storage controller 300 may write the data to the plurality of nonvolatile memory devices 400a~400k or read the data from plurality of nonvolatile memory devices 400a~400k based on the command signal and the address signal. That is, storage controller 300 may communicate with the host 100 through the connector 240.

Each of the nonvolatile memory devices 400a~400k may receive write data from the storage controller 300 based on a data strobe signal and data signals and may output read data to the storage controller 300 based on the data strobe signal and the data signals. In this case, the storage controller 300 may delay the data signals such that at least some edges of the data signal are desynchronized by skew offsets and may transmit the delayed data signals to each of the nonvolatile memory devices 400a~400k. This structure and operation will be described in more detail below.

The storage controller 300 may communicate the data signals with the host 100 using the volatile memory device 250 as an input/output buffer. In some example embodiments, the volatile memory device 250 may include a dynamic random access memory (DRAM). Each of the nonvolatile memory devices 400a~400k and the volatile memory device 250 may be referred to as a semiconductor memory device.

The power supply circuit 500 may be configured to receive a power supply voltage VES (i.e., external supply voltage) from the host 100 through the power connector 243. The power supply circuit 500 may generate adaptively at least one first operation voltage VOP1 used by the plurality of nonvolatile memory devices 400a~400k, at least one second operation voltage VOP2 used by the storage controller 300, and at least one third operation voltage VOP3 used by the volatile memory device 250 based on the power supply voltage VES.

The power supply circuit 500 may provide the at least one first operation voltage VOP1 to the plurality of nonvolatile memory devices 400a~400k, may provide the at least one second operation voltage VOP2 to the storage controller 300, and may provide the at least one third operation voltage VOP3 to the volatile memory device 250.

Figure 2:
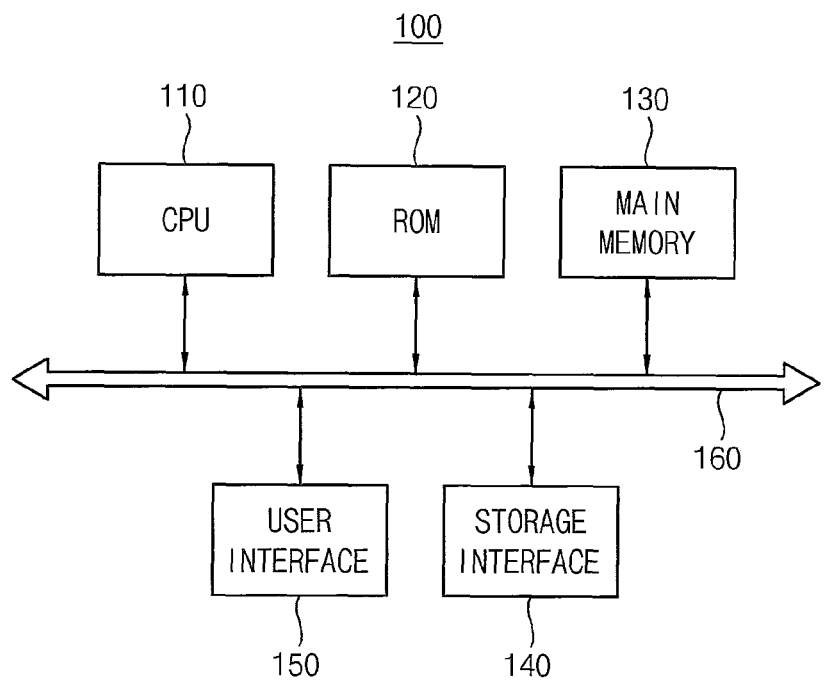
FIG. 2 is a block diagram illustrating a host of the storage system of FIG. 1 according to example embodiments.

FIG. 2 is a block diagram illustrating the host of the storage system of FIG. 1 according to example embodiments.

Referring to FIG. 2, the host 100 may include a central processing unit (CPU) 110, a read-only memory (ROM) 120, a main memory 130, a storage interface 140, a user interface 150 and a bus 160.

The bus 160 may refer to a transmission channel via which data is transmitted between the CPU 110, the ROM 120, the main memory 130, the storage interface 140 and the user interface 150 of the host 100.

The ROM 120 may store various application programs. For example, application programs supporting storage protocols such as Advanced Technology Attachment (ATA), Small Computer System Interface (SCSI), embedded Multi Media Card (eMMC), and/or Unix File System (UFS) protocols are stored.

The main memory 130 may temporarily store data or programs. The user interface 150 may be a physical or virtual medium for exchanging information between a user and the host device 100, a computer program, etc., and includes physical hardware and logical software. For example, the user interface 150 may include an input device for allowing the user to manipulate the host 100, and an output device for outputting a result of processing an input of the user.

The CPU 110 may control overall operations of the host 100. The CPU 110 may generate a command for storing data in the storage device 200 or a request (or a command) for reading data from the storage device 200 by using an application stored in the ROM 120, and transmit the request to the storage device 200 via the storage interface 140.

Figure 3:
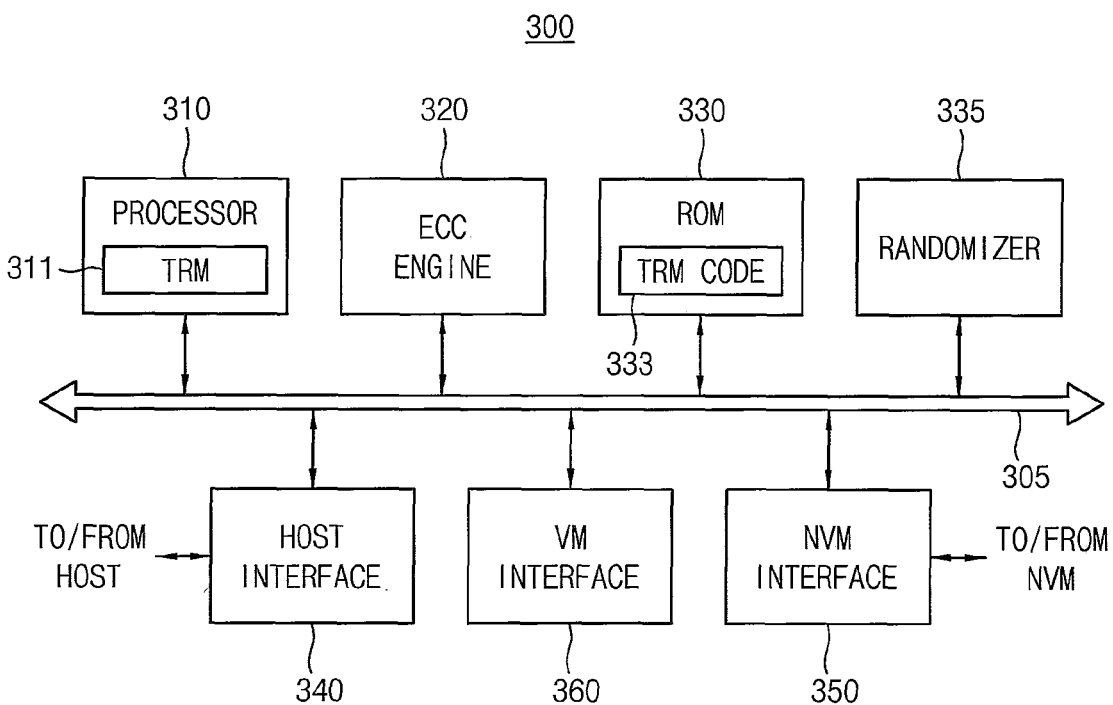
FIG. 3 is a block diagram illustrating an example of a storage controller of the storage system of FIG. 1 according to example embodiments.

FIG. 3 is a block diagram illustrating an example of the storage controller of the storage system of FIG. 1 according to example embodiments.

Referring to FIG. 3, the storage controller 300 may include a processor 310, an error correction code (ECC) engine 320, a ROM 330, a randomizer 335, a host interface 340, a volatile memory (VM) interface 360 and a nonvolatile memory (NVM) interface 350 which are connected via a bus 305.

The processor 310 controls an overall operation of the storage controller 300. The processor 310 may include a training manager (TRM) 311. The training manager 311 may perform training such that at least some edges of the data signals exchanged between the storage controller 300 and each of the nonvolatile memory devices 400a~400k are desynchronized by first skew offsets which are different from one another.

The skew offsets may correspond to differences of the edges of the data signals and the differences of the edges may reduce crosstalk occurring from among the data signals provided to each of the nonvolatile memory devices 400a~400k through signal lines such that an eye window of the data signals is equal to or greater than a reference value. For example, an area of the eye window of the data signals may be equal to or greater than a reference area. As another example, a length of the eye window of the data signals may be equal to or greater than a reference length. The first training manager 311 may store skew offsets in a register of the storage controller 300 as skew information.

Memory cells of the nonvolatile memory devices 400a~400k may have a physical characteristic that a threshold voltage distribution varies for various reasons, such as a program elapsed time, a temperature, program disturbance, read disturbance and etc. For example, data stored at the nonvolatile memory devices 400a~400k may become erroneous for one or more of these reasons. The storage controller 300 utilizes a variety of error correction techniques to correct such errors. For example, the storage controller 300 may include the ECC engine 320. The ECC engine 320 may correct errors in data read from the nonvolatile memory devices 400a~400k.

The ROM 330 may store firmware that may be read and executed by the processor 310, and the firmware may be loaded in the volatile memory device 250 by the processor 310 and executed by the processor 310. The ROM 330 may store training manager code (TRM Code) 333 as the firmware. In other words, the training manger code (TRM Code) 333 may be read and executed by the processor 310 as the training manager 311.

The randomizer 335 randomizes data to be stored in the nonvolatile memory devices 400a~400k. For example, the randomizer 335 may randomize data to be stored in the nonvolatile memory devices 400a~400k in a unit of a word-line.

Data randomizing processes data such that program states of memory cells connected to a word-line have the same ratio. For example, if memory cells connected to one word-line are multi-level cells (MLC) each storing 2-bit data, each of the memory cells has one of an erase state and first through third program states. In this case, the randomizer 335 randomizes data such that, in memory cells connected to one word-line, the number of memory cells having the erase state, the number of memory cells having the first program state, the number of memory cells having the second program state, and the number of memory cells having the third program state are substantially the same as one another. For example, memory cells in which randomized data is stored have program states of which the number is equal to one another.

The randomizer 335 de-randomizes data read from the nonvolatile memory devices 400a~400k.

The storage controller 300 may communicate with the host 100 through the host interface 340 and may communicate with the nonvolatile memory devices 400a~400k through the nonvolatile memory (NVM) interface 350. The storage controller 300 may control the volatile memory device 250 through the volatile memory (VM) interface 360.

Figure 4:
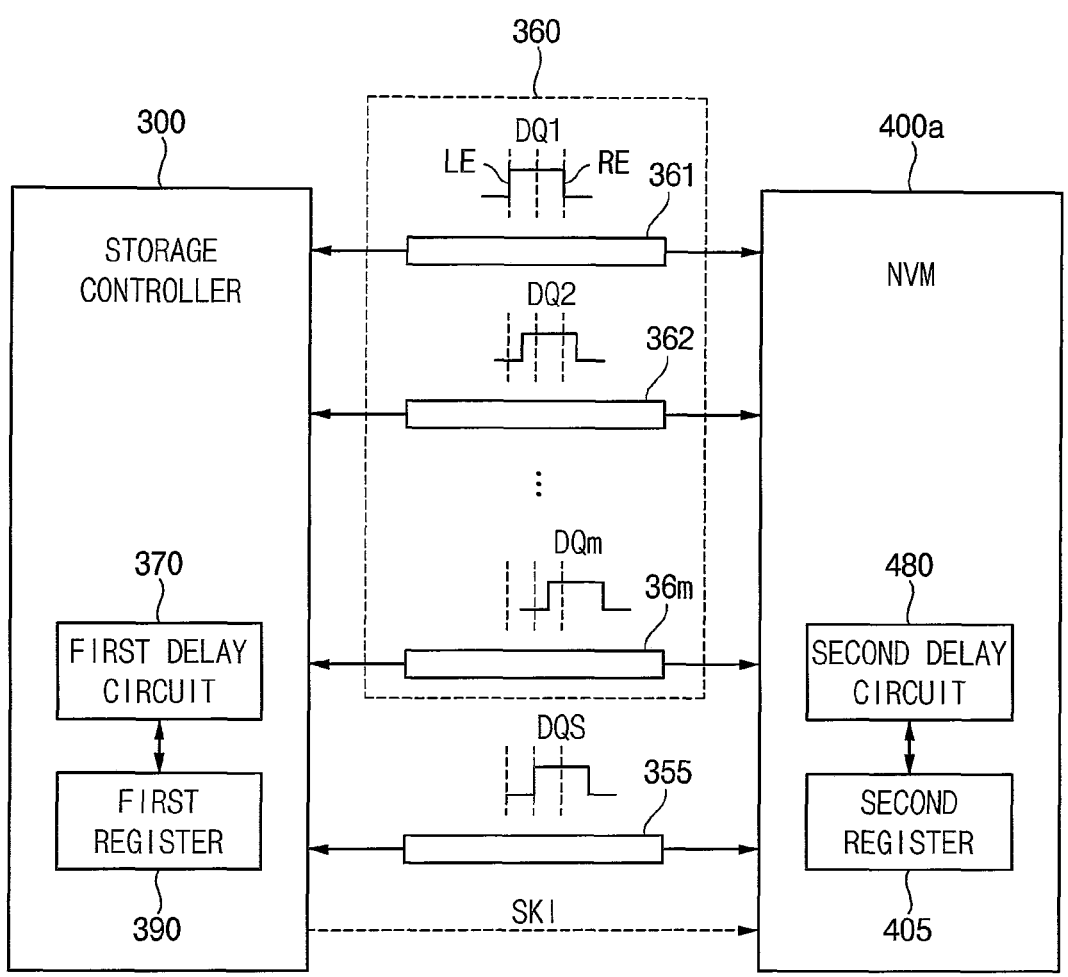
FIG. 4 is illustrates the storage controller, a first delay circuit, and a nonvolatile memory device in a storage device of the storage system of FIG. 1 according to example embodiments.

FIG. 4 is illustrates the storage controller and one of the nonvolatile memory devices in the storage device of the storage system of FIG. 1 according to example embodiments.

Referring to FIG. 4, the storage controller 300 may exchange data signals DQ1~DQm (m is an integer greater than three) with the nonvolatile memory device 400a through a transmission line including a plurality of signal lines 361~36m and may exchange a data strobe signal DQS with the nonvolatile memory device 400a through a signal line 355.

The plurality of signal lines 361~36m and the signal line 355 may constitute a channel, and may be provided (formed) in a printed circuit board (PCB). Therefore, as a gap between the signal lines 361~36m is reduced, a crosstalk or a noise due to the crosstalk may occur in the data signals DQ1~DQm on the signal lines 361~36m if the data signals DQ1~DQm on the signal lines 361~36m have the same edges.

The storage controller 300 may include a first delay circuit 370 that delays the data signals DQ1~DQm such that at least some edges of the data signals DQ1~DQm on the signal lines 361~36m are desynchronized by first skew offsets which are different from one another. In some example embodiments, the first delay circuit 370 may be a first spread delay-locked loop (SDLL) circuit 370, and may be referred to a delay-locked loop circuit.

The storage controller 300 may include a first register 390 that stores the first skew offsets associated with the data signals DQ1~DQm as skew information. The storage controller 300 may transmit the skew information SKI stored in the first register 390 to the nonvolatile memory device 400a by using at least one of a set feature command, a mode register set and a test mode register set.

The nonvolatile memory device 400a may include a second delay circuit 480 and a second register 405. In some example embodiments, the second delay circuit 480 may be a second spread delay-locked loop (SDLL) circuit, and may be referred to a delay-locked loop circuit The second register 405 may store the skew information SKI received from the storage controller 300 and the second delay circuit 480 may delay the data signals DQ1~DQm by second skew offsets for cancelling the first skew offsets to provide original data signals based on the skew information SKI and may sample the original data signals based on the data strobe signal DQS to provide the sampled original data signals an inside of the nonvolatile memory device 400a.

Each of the data signals DQ1~DQm may have a unit interval (UI) determined by a first edge (a left edge LE) and a second edge (a right edge RE). That is, the first edge and the second edge may define the unit interval. The first edge (the left edge) denotes a closed portion of a left side (or first in time) of the unit interval UI of an eye pattern of each of the data signals DQ1~DQm. The second edge (the right edge) denotes a closed portion of a right side (or later in time) of the unit interval UI of each of the data signals DQ1~DQm. Further, the expression "unit interval UI" may be used interchangeably with the term "window of a data signal".

In FIG. 4, the data signals DQ1~DQm on the signal lines 361~36m are desynchronized from one another by the first skews which are different from one another. That is, the first edges of the data signals DQ1~DQm on the signal lines 361~36m have differences according to the first skew offsets. Therefore, the crosstalk occurring in the data signals DQ1~DQm on the signal lines 361~36m may be reduced.

When the storage device 200 is booted or initialized, the processor 310 (i.e., executing the training manager 311) in FIG. 3 may transmit training patterns to the nonvolatile memory device 400a through the signal lines 361~36m, may perform training to search skew offset for minimizing crosstalk (that is, maximizing an eye) occurring among from the training patterns on the signal lines 361~36m such that an eye window of the training patterns is equal to or greater than a reference value, and may store the first skew offsets in the first register 390 as the skew information SKI based on a result of the training. The processor 310 may search for the skew offsets by performing the training sequentially on the training patterns on the signal lines 361~36m.

Figure 5:
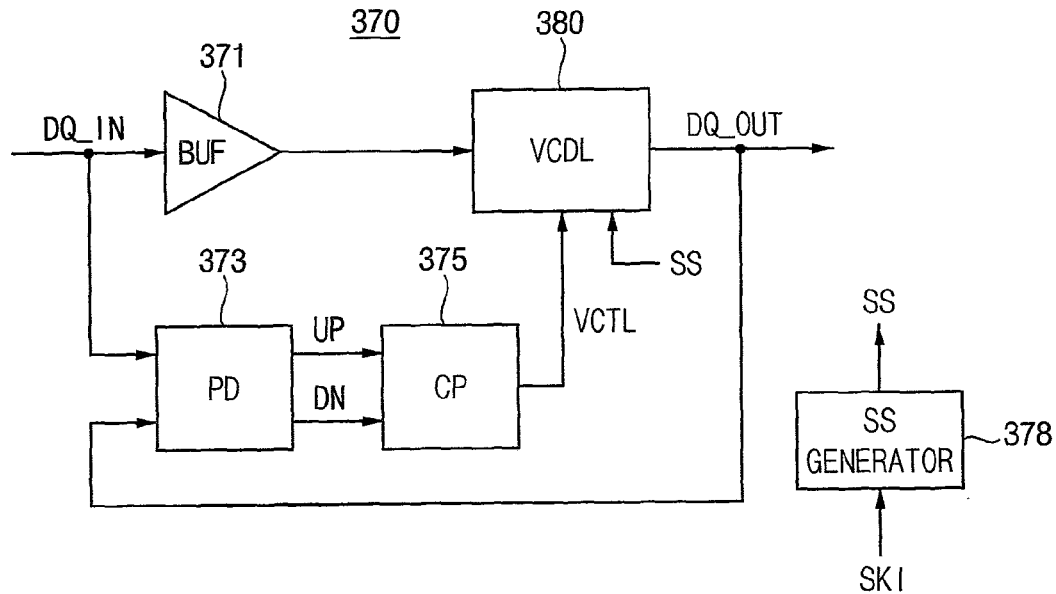
FIG. 5 is a block diagram illustrating an example of the first delay circuit in FIG. 4 according to example embodiments.

FIG. 5 is a block diagram illustrating an example of the first delay circuit 370 in FIG. 4 according to example embodiments.

Referring to FIG. 5, the first delay circuit 370 may include a buffer (BUF) 371, a voltage-controlled delay line (VCDL) 380, a phase detector (PD) 373, a charge pump (CP) 375 and a selection signal generator 378.

The buffer 371 buffers input data signal DQ_IN corresponding to a data signal before being delayed. The phase detector 373 detects a phase difference between the input data signal DQ_IN and output data signal DQ_OUT, and outputs an up signal UP and/or a down signal DN based on the detected phase difference. The charge pump 375 performs a charging/discharging operation based on the up signal UP and/or the down signal DN to output a control voltage VCTL. The charge pump 375 may perform a charging operation based on the up signal UP and may perform a discharging operation based on the down signal DN.

The VCDL 380 may adjust a delay amount of the input data signal DQ_IN that is output from the buffer 371 based on the control voltage VCTL to provide the output data signal DQ_OUT corresponding to the data signal DQ. The selection signal generator 378 generates a selection signal SS based on the skew information SKI and provides the selection signal SS to the VCDL 380.

Figure 6:
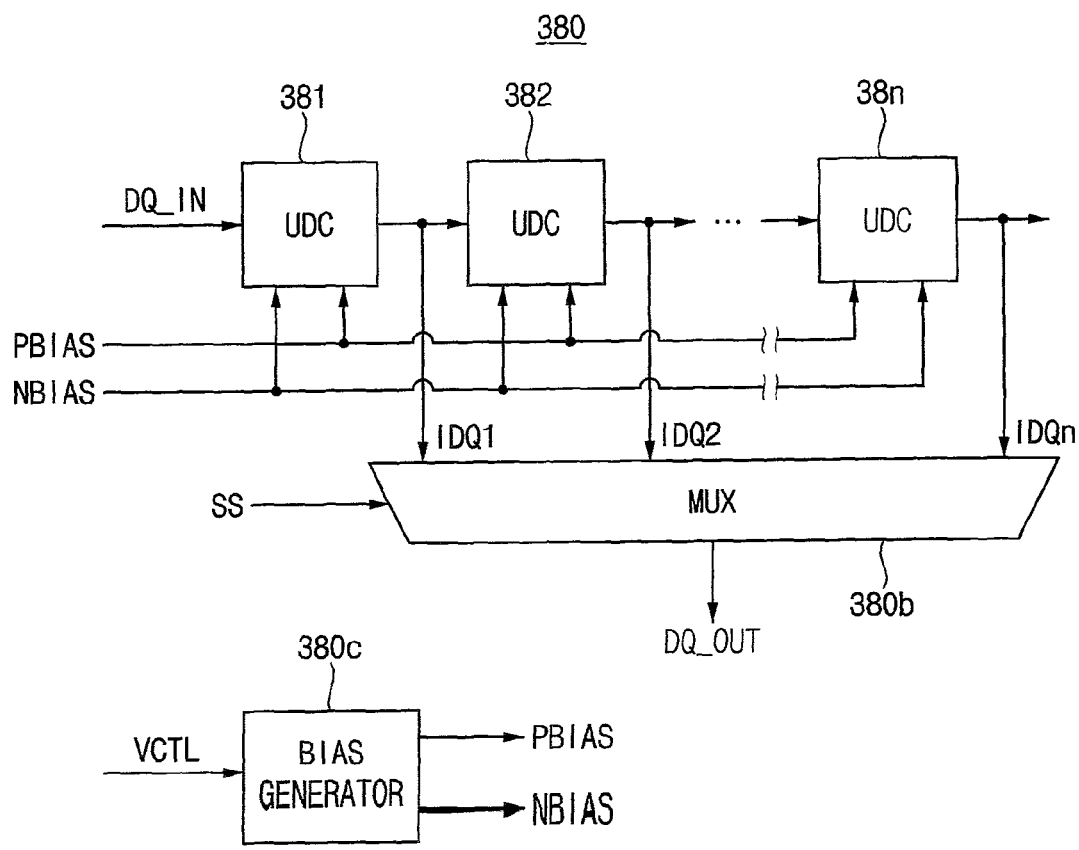
FIG. 6 is a block diagram illustrating an example of a voltage-controlled delay line (VCDL) of the first delay circuit of FIG. 5 according to example embodiments.

FIG. 6 is a block diagram illustrating an example of the voltage-controlled delay line (VCDL) 380 in FIG. 5 according to example embodiments.

Referring to FIG. 6, the VCDL 380 may include a plurality of unit delay cells (UDC)s 381~38n (n is an integer greater than two), a multiplexer (MUX) 380b and a bias generator 380c.

The plurality of unit delay cells 381~38n are connected in series, each of the unit delay cells 381~38n delays an output from a previous unit delay cell to output a respective one of internal data signals IDQ1~IDQn based on bias voltages PBIAS and/or NBIAS and provides the output to next unit delay cell. The multiplexer 380b selects one of the internal data signals IDQ1~IDQn based on the selection signal SS to output the selected one as the output data signal DQ_OUT. The bias generator 380c may generate the bias voltages PBIAS and/or NBIAS based on the control voltage VCTL and may provide the bias voltages PBIAS and/or NBIAS to the plurality of unit delay cells 381~38n.

A configuration of the second delay circuit 480 illustrated in FIG. 4 may have substantially the same configuration an operation as the first delay circuit 370 of FIG. 5, and therefore a repeated description thereof is omitted for conciseness.

Figure 7:
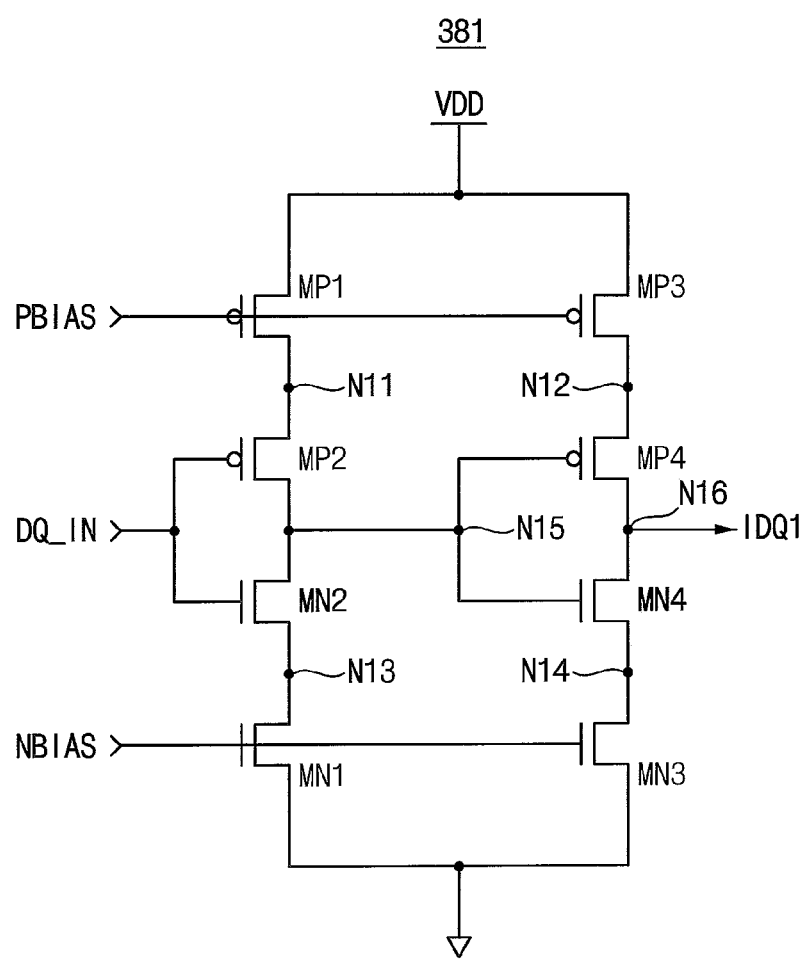
FIG. 7 is a circuit diagram illustrating a unit delay cell of the VCDL of FIG. 6 according to example embodiments.

FIG. 7 is a circuit diagram illustrating a unit delay cell of the voltage-controlled delay line (VCDL) 380 in FIG. 6 according to example embodiments. FIG. 7 illustrates the unit delay cell 381 of the plurality of unit delay cells 381~38n as an example. However, it will be understood that the remaining ones of the unit delay cells 382~38n have a similar configuration and operation as the unit delay cell 381 and thus a repeated description thereof are omitted for conciseness.

Referring to FIG. 7, the unit delay cell 381 may include a plurality of p-channel metal-oxide semiconductor (PMOS) transistors MP1, MP2, MP3 and MP4 and a plurality of n-channel metal-oxide semiconductor (NMOS) transistors MN1, MN2, MN3 and MN4.

The PMOS transistors MP1 and MP3 are connected between a power supply voltage VDD and nodes N11 and N12 respectively and the PMOS transistors MP1 and MP3 are connected in parallel. The PMOS transistor MP2 is connected between the node N11 and a node N15 and the PMOS transistor MP4 is connected between the node N12 and a node N16. The NMOS transistor MN2 is connected between the node N15 and a node N13, the NMOS transistor MN4 is connected between the node N16 and a node N14, the NMOS transistor MN1 is connected between the node N13 and a ground voltage and the NMOS transistor NM3 is connected between the node N14 and the ground voltage.

The bias voltage PBIAS is applied to the gates of the PMOS transistors MP1 and MP3 and the bias voltage NBIAS is applied to the gates of the NMOS transistors MN1 and MN3. A first inverter implemented with the PMOS transistor MP2 and the NMOS transistor MN2 inverts the input data signal DQ_IN to provide the inverted input data signal to the node N15, and a second inverter implemented with the PMOS transistor MPa4 and the NMOS transistor MN4 inverts the voltage of the node N15 to provide the internal data signal IDQ1 at the node N16.

Delay characteristic of the first inverter and the second inverter may be determined by the bias voltages PBIAS and NBIAS. In addition, the first inverter and the second inverter are connected in series, and thus the unit delay cell 381 operates as a buffer to delay the input data signal DQ_IN.

Figure 8:
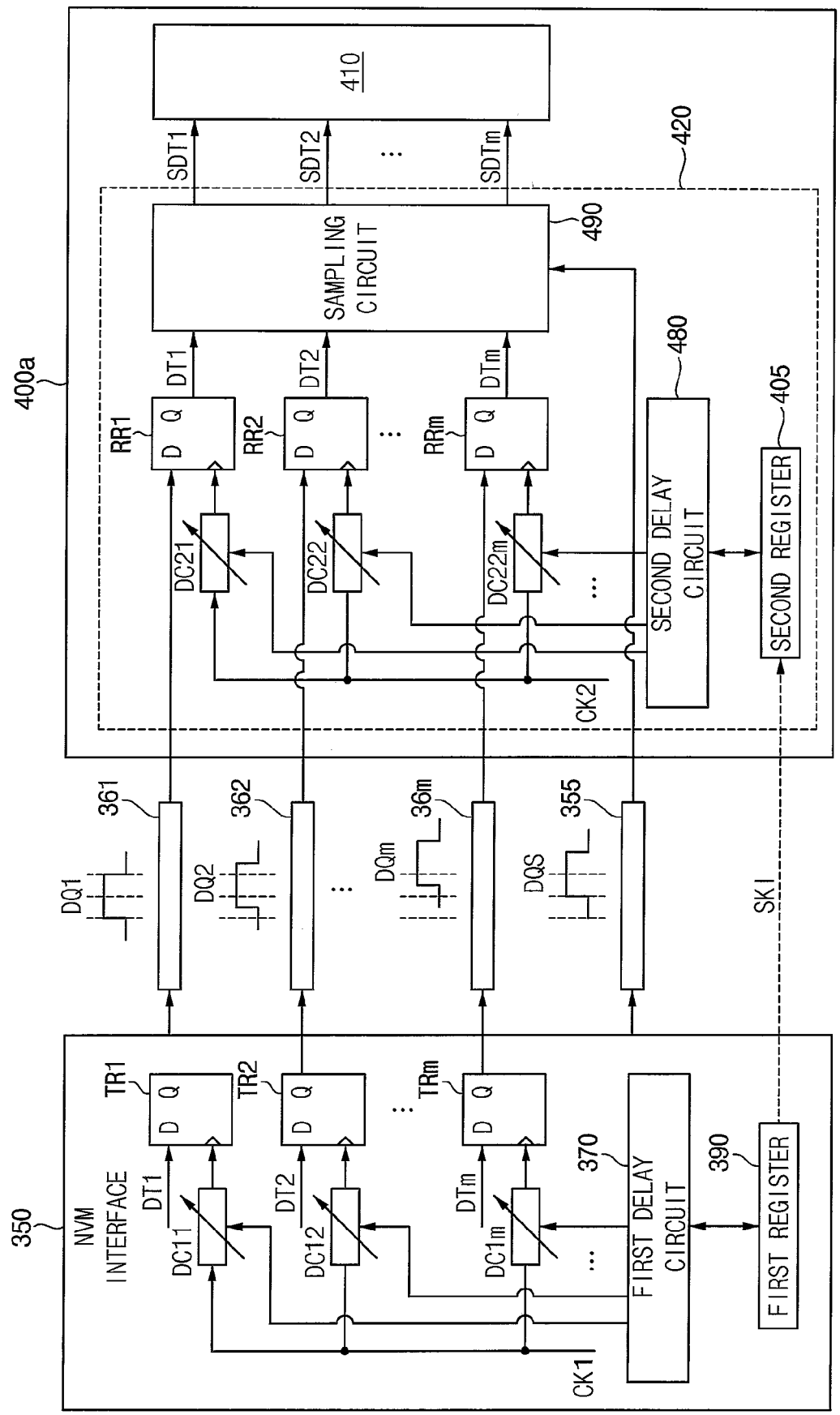
FIG. 8 illustrates a nonvolatile memory interface in the storage controller of FIG. 4 and the nonvolatile memory device of FIG. 4 according to example embodiments.

FIG. 8 illustrates the nonvolatile memory interface in the storage controller of FIG. 4 and the nonvolatile memory device of FIG. 4, according to example embodiments.

Referring to FIG. 8, the nonvolatile memory (NVM) interface 350 interfaces with the nonvolatile memory device (NVM) 400a and may include the first delay circuit 370 and the first register 390. The nonvolatile memory interface 350 may further include a plurality of transmission latches TR1~TRm and a plurality of delay cells DC11~DC1m (m is an integer greater than two). In some example embodiments, the plurality of delay cells DC11~DC1m may be included as a portion of the first delay circuit 370.

As described above, the first register 390 may store the first skew offsets based on a result of the training, the first delay circuit 370 may adjust delay amount of respective ones of the delay cells DC11~DC1m based on the first skew offsets stored in the first register 390, and each of the delay cells DC11~DC1m may delay a clock signal CK1 based on the adjusted delay amount to provide respective ones of delayed clock signals to the transmission latches TR1~TRm. A clock generator in the nonvolatile memory interface 350 may generate the clock signal CK1.

Each of the transmission latches TR1~TRm may sample a respective one of original data signals DT1~DTm in synchronization with a respective one of the delayed clock signals to output a respective one of the data signals DQ1~DQm. Each of the transmission latches TR1~TRm transmit the respective one of the delayed clock signals to output a respective one of the data to the nonvolatile memory device 400 through the signal lines 361~36m. Accordingly, the first edges of the windows of the data signals DQ1~DQm on the signal lines 361~36m are desynchronized as illustrated, the crosstalk occurring among from the data signals DQ1~DQm on the signal lines 361~36m may be reduced.

The nonvolatile memory interface 350 may transmit the data strobe signal DQS and the skew information SKI on the first skew offsets to the nonvolatile memory device 400a.

The nonvolatile memory device 400a may include a data input/output (I/O) circuit 420 and a page buffer circuit 410. The data input/output (I/O) circuit 420 may include the second delay circuit 480 and the second register 405 described with reference to FIG. 4. The data I/O circuit 420 may further include a plurality of reception latches RR1~RRm, a plurality of delay cells DC21~DC2m (m is an integer greater than two) and a sampling circuit 490. In some example embodiments, the plurality of delay cells DC21~DC2m may be included as a portion of the second delay circuit 480.

The second register 405 may store the skew information SKI received from the nonvolatile memory (NVM) interface 350. The second delay circuit 480 may adjust a delay amount of a respective one of the delay cells DC11~DC1m based on the skew information SKI by second skew offsets for cancelling the first skew offsets. Each of the delay cells DC21~DC2m may delay a clock signal CK2 based on the adjusted delay amount to provide a respective one of delayed clock signals to the reception latches RR1~RRm. Each of the reception latches RR1~RRm may sample a respective one of the data signals DQ1~DQm in synchronization with a respective one of the delayed clock signals to provide a respective one of the original data signals DT1~DTm to the sampling circuit 490.

The sampling circuit 490 may sample the original data signals DT1~DTm based on the data strobe signal DQS to align the original data signals DT1~DTm and provide the sampled data signals SDT1~SDTm to the page buffer circuit 410. The page buffer circuit 410 may buffer the sampled data signals SDT1~SDTm prior to output.

A clock generator in the data I/O circuit 420 may generate the clock signal CK2.

FIG. 9 illustrates an example of the first register 390 in FIG. 8.

Referring to FIG. 9, the first register 390 may store first skew offsets OFS1 of the data signals DQ1~DQm in a form of a table. When the first skew offset of the data signal DQ0 is set to '0', the first register 390 may store the first skew offset of the data signal DQ1 as '+a', the first skew offset of the data signal DQ2 as '+b' and the first skew offset of the data signal DQm as '+p'. In other words, the first skew offset of the data signal DQ1 may be 0+a, the first skew offset of the data signal DQ2 may be 0+b, and so forth. However, this is only an example, and various other methods of storing the first skew offsets are contemplated.

FIG. 10 illustrates an example of the second register 405 in FIG. 8.

Referring to FIG. 10, the second register 405 may store second skew offsets OFS2 for cancelling the first skew offsets OFS1 of the data signals DQ1~DQm in a form of a table. When the second skew offset of the data signal DQ0 is set to '0', the second register 405 may store the second skew offset of the data signal DQ1 as '−a', the second skew offset of the data signal DQ2 as '−b' and the second skew offset of the data signal DQm as '−p'. In other words, the second skew offset of the data signal DQ1 may be 0−a, the first skew offset of the data signal DQ2 may be 0−b, and so forth. However, this is only an example, and various other methods of storing the second skew offsets are contemplated.

Figure 11:
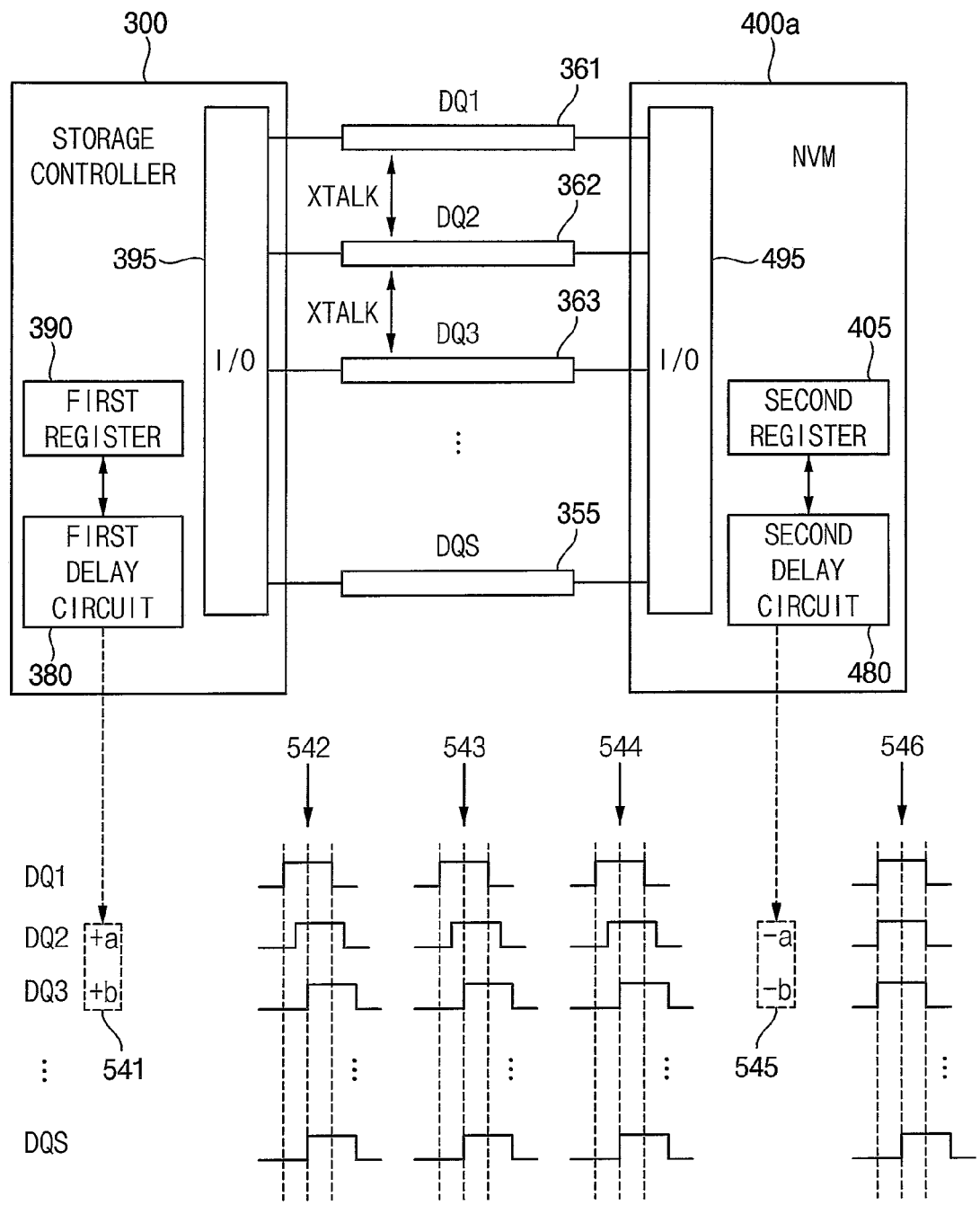
FIG. 11 illustrates data signals and data strobe signals during communications between the storage controller and the nonvolatile memory device of FIG. 4, according to example embodiments.

FIG. 11 illustrates data signals and data strobe signals during communications between the storage controller and the nonvolatile memory device of FIG. 4, according to example embodiments.

In FIG. 11, for convenience of explanation, the data signals DQ1, DQ2 and DQ3 and the data strobe signal DQS are illustrated, first skew offsets denoted by a reference numeral 541 is the same as the first skew offsets OFS1 in FIG. 9, and second skew offsets denoted by a reference numeral 546 is the same as the second skew offsets OFS2 in FIG. 10.

In addition, an I/O interface 395 may be included in the nonvolatile memory interface 350 in FIG. 8 and an I/O interface 495 may be included in the data I/O circuit 420 in FIG. 8.

Referring to FIG. 11, the data signal DQ2 has a skew offset of '+a' with respect to the data signal DQ1 and the data signal DQ3 has a skew offset of '+b' with respect to the data signal DQ1 at a position 542 between the I/O interface 395 and the signal lines 361, 362 and 363, at a position 543 on the signal lines 361, 362 and 363 and at a position 544 between the signal lines 361, 362 and 363 and the I/O interface 495. The first edges of the data signals DQ1, DQ2 and DQ3 are synchronized with respect to one another at a position 546 corresponding to an output of the second delay circuit 480.

Unlike that illustrated in FIG. 11, crosstalk XTALK may occur at the position 543 on the signal lines 361, 362 and 363 when the data signals DQ1, DQ2 and DQ3 are not desynchronized. According to example embodiments as illustrated in FIG. 11, since first edges of the data signals DQ1, DQ2 and DQ3 are desynchronized by the first offsets at the position 543 on the signal lines 361, 362 and 363, the crosstalk XTALK occurring among from the data signals DQ1, DQ2 and DQ3 may be reduced.

Figure 12:
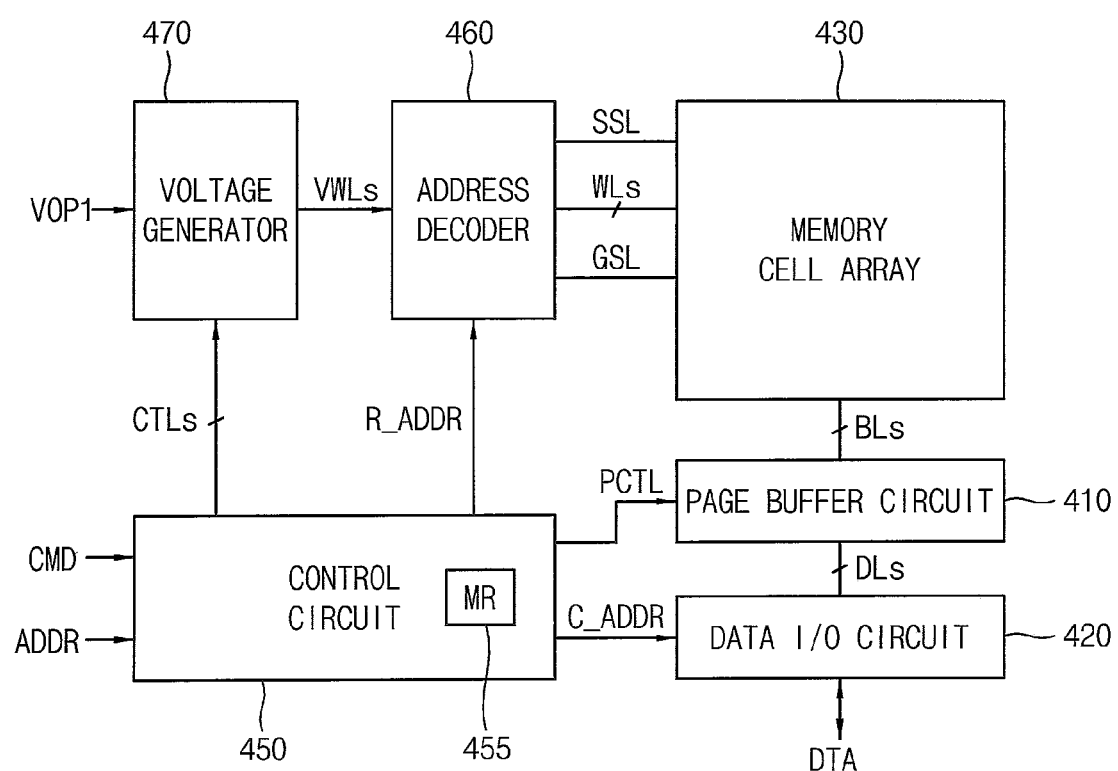
FIG. 12 is a block diagram illustrating a nonvolatile memory device of a storage device of the storage system of FIG. 1 according to example embodiments.

FIG. 12 is a block diagram illustrating a nonvolatile memory device in the storage device of the storage system of FIG. 1 according to example embodiments.

Referring to FIG. 12, the nonvolatile memory device (NVM) 400a includes a memory cell array 430, an address decoder 460, the page buffer circuit 410, the data input/output circuit 420, a control circuit 450, and a voltage generator 470. The control circuit 450 may include a mode register (MR) 455 to store the second skew offsets.

The memory cell array 430 is coupled to the address decoder 460 through a string selection line SSL, a plurality of word lines WLs, and a ground selection line GSL. In addition, the memory cell array 430 is coupled to the page buffer circuit 410 through a plurality of bit lines BLs. The memory cell array 430 includes a plurality of memory cells coupled to the plurality of word lines WLs and the plurality of bit lines BLs. The memory cell array 430 may include a plurality of memory cells coupled to the plurality of word lines WLs stacked in a vertical direction which is perpendicular to a substrate.

Figure 13:
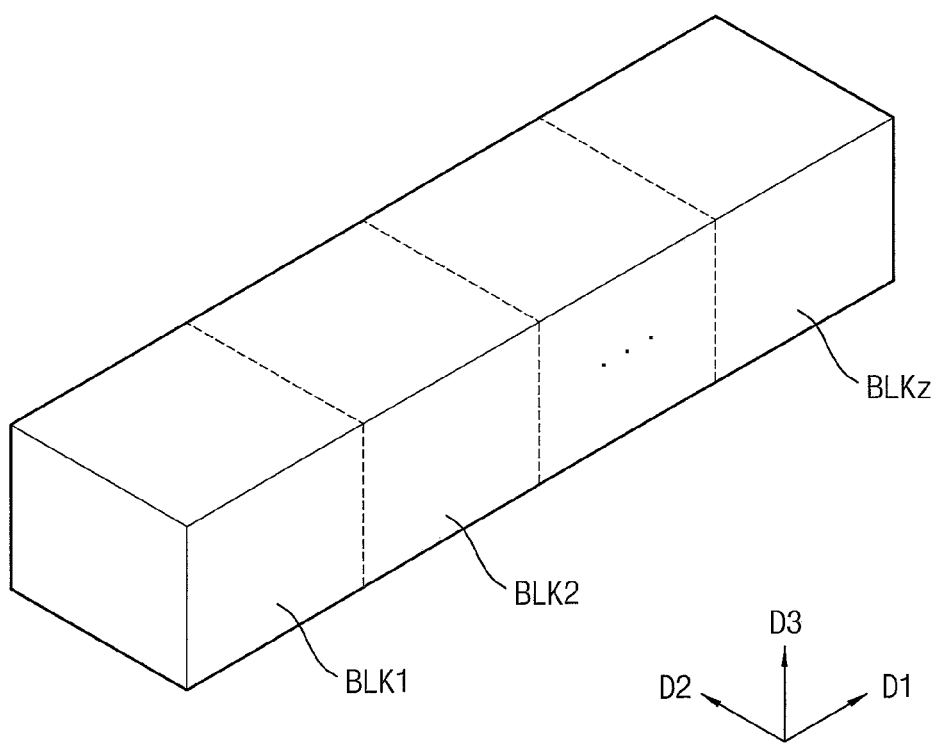
FIG. 13 illustrates a block diagram of a memory cell array in the nonvolatile memory device of FIG. 12.

FIG. 13 illustrates a block diagram of the memory cell array 430 in the nonvolatile memory device (NVM) 400a of FIG. 12.

Referring to FIG. 13, the memory cell array 430 may include a plurality of memory blocks BLK1 to BLKz. The memory blocks BLK1 to BLKz extend along a first direction D1, a second direction D2, and a third direction D3. In some example embodiments, the memory blocks BLK1 to BLKz are selected by the address decoder 460 in FIG. 12. For example, the address decoder 460 may select a memory block BLK corresponding to a block address among the memory blocks BLK1 to BLKz.

Figure 14:
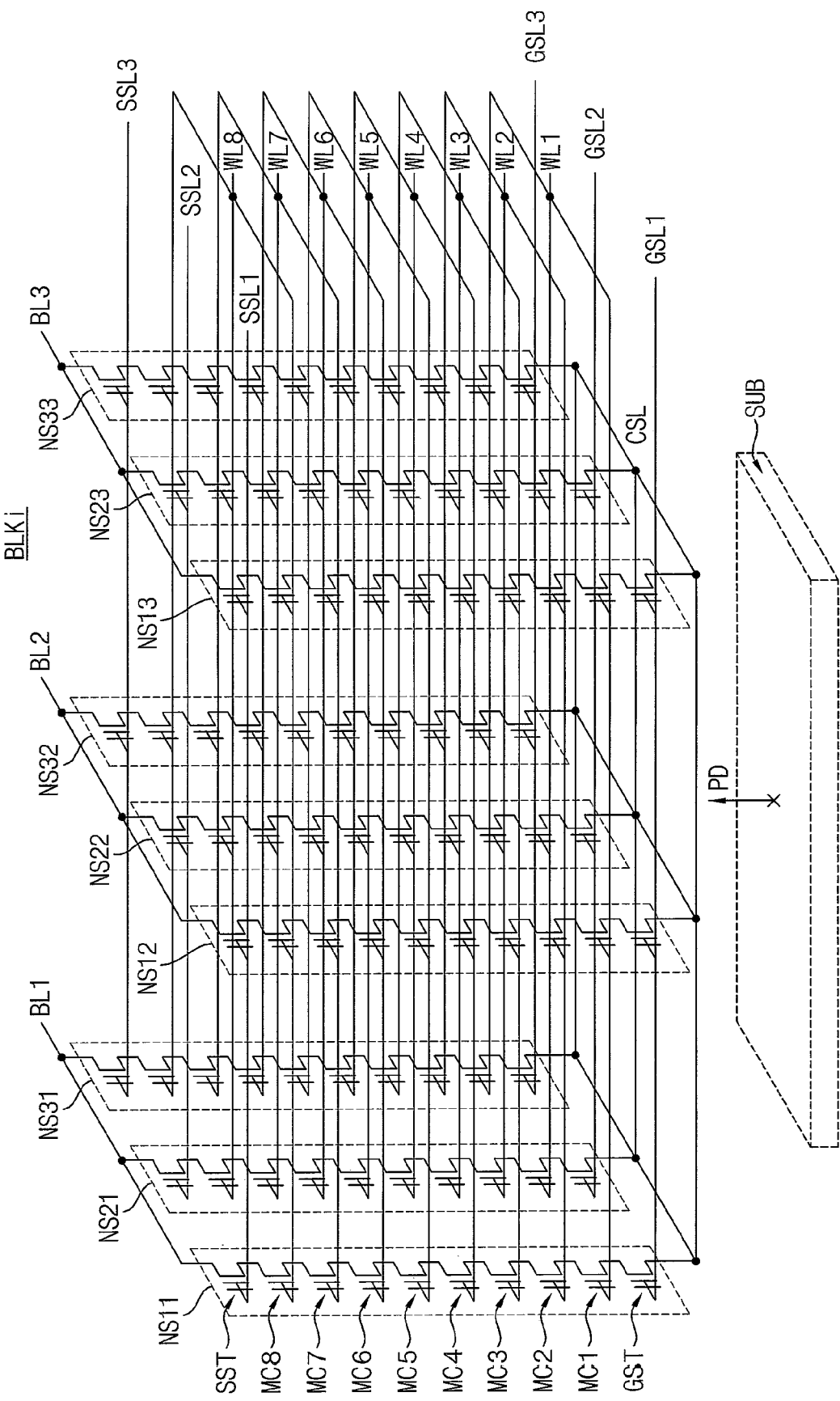
FIG. 14 illustrates a circuit diagram of a memory block of the memory cell array of FIG. 13.

FIG. 14 illustrates a circuit diagram of a memory block of the memory cell array 430 of FIG. 13.

The memory block BLKi of FIG. 14 may be formed on a substrate SUB in a three-dimensional structure (or a vertical structure). For example, a plurality of memory cell strings included in the memory block BLKi may be formed in a direction PD perpendicular to the substrate SUB.

Figure 19:
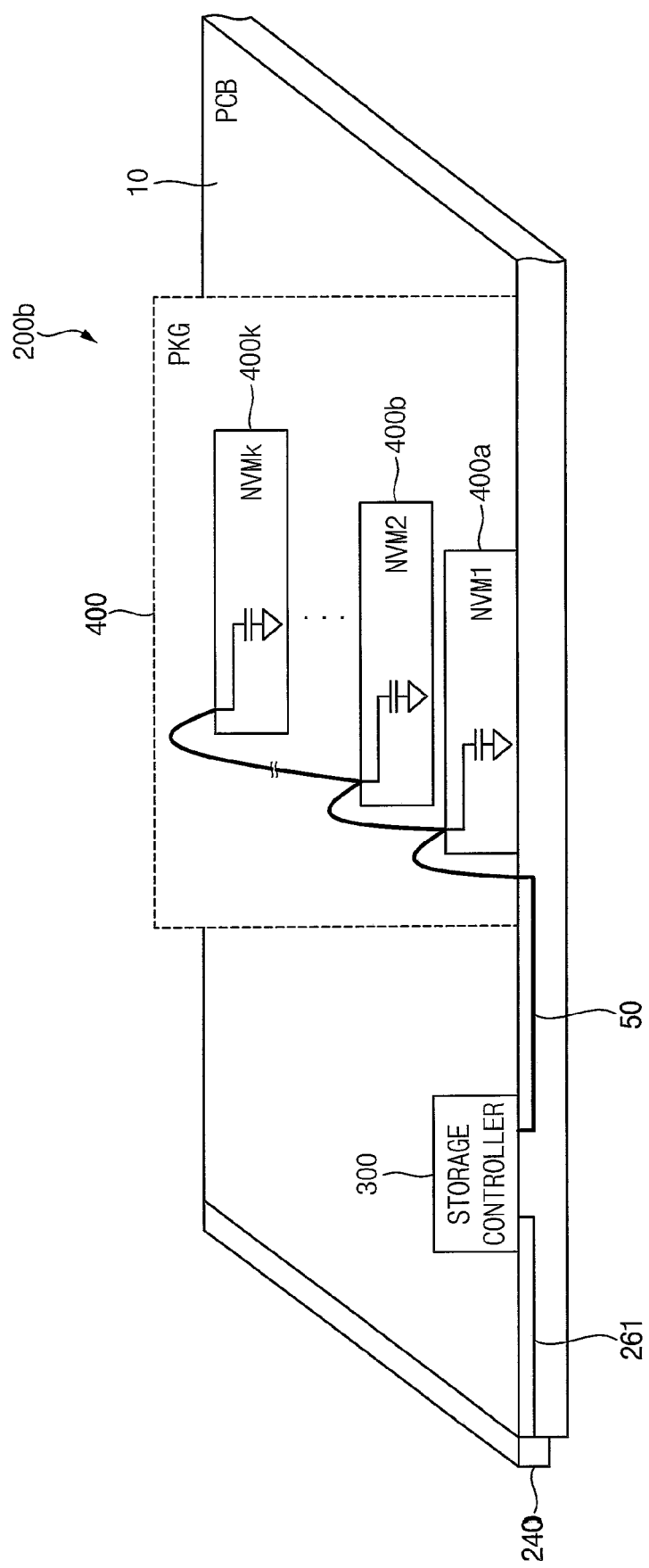
FIG. 19 is a block diagram illustrating an example of a storage device of the storage system of FIG. 1 according to example embodiments.

Referring to FIG. 14, the memory block BLKi may include memory cell strings NS11, NS12, NS13, NS21, NS22, NS23, NS31, NS32 and NS33 (which may hereinafter be referred to as memory cell strings NS11 to NS33) coupled between bit-lines BL1, BL2 and BL3 and a common source line CSL. Each of the memory cell strings NS11 to NS33 may include a string selection transistor SST, a plurality of memory cells MC1, MC2, MC3, MC4, MC5, MC6, MC7 and MC8 (which may hereinafter be referred to as memory cells MCi to MC8), and a ground selection transistor GST. In FIG. 19, each of the memory cell strings NS11 to NS33 is illustrated to include eight memory cells MCi to MC8. However, example embodiments are not limited thereto. In some example embodiments, each of the memory cell strings NS11 to NS33 may include any number of memory cells.

The string selection transistor SST may be connected to corresponding string selection lines SSL1, SSL2 and SSL3. The plurality of memory cells MCi to MC8 may be respectively connected to corresponding word-lines WL1, WL2, WL3, WL4, WL5, WL6, WL7 and WL8 (which may hereinafter be referred to as word-lines WL to WL8). The ground selection transistor GST may be connected to corresponding ground selection lines GSL1, GSL2 and GSL3. The string selection transistor SST may be connected to corresponding bit-lines BL1, BL2 and BL3, and the ground selection transistor GST may be connected to the common source line CSL.

Word-lines (e.g., WL1) having the same height may be commonly connected, and the ground selection lines GSL1 to GSL3 and the string selection lines SSL1 to SSL3 may be separated. In FIG. 14, the memory block BLKi is illustrated to be coupled to eight word-lines WL1 to WL8 and three bit-lines BL1 to BL3. However, example embodiments are not limited thereto. In some example embodiments, the memory cell array 430 may be coupled to any number of word-lines and bit-lines.

Referring back to FIG. 12, the control circuit 450 may receive the command signal CMD and the address signal ADDR from the storage controller 300 and control an erase operation, a program operation, and a read operation of the nonvolatile memory device 400a based on the command signal CMD and the address signal ADDR.

For example, the control circuit 450 may generate control signals CTLs, which are used for controlling the voltage generator 470, based on the command signal CMD, and generate a row address R_ADDR and a column address C_ADDR based on the address signal ADDR. The control circuit 450 may provide the row address R_ADDR to the address decoder 460 and provide the column address C_ADDR to the data input/output circuit 420.

In an example embodiment, the address decoder 460 is coupled to the memory cell array 430 through the string selection line SSL, the plurality of word lines WLs, and the ground selection line GSL.

In an example embodiment, the voltage generator 470 generates word line voltages VWLs using the first operation voltage VOP1, which are used for the operation of the nonvolatile memory device 400a, based on the control signals CTLs. The word line voltages VWLs are applied to the plurality of word lines WLs through the address decoder 460.

In an example embodiment, the page buffer circuit 410 is coupled to the memory cell array 430 through the plurality of bit lines BLs. The page buffer circuit 410 may include a plurality of page buffers. In exemplary embodiments, one page buffer may be connected to one bit line. In other exemplary embodiments, one page buffer may be connected to two or more bit-lines. The page buffer circuit 410 may temporarily store data to be programmed in a selected page or data read out from the selected page. The page buffer circuit 410 is controlled in response to a control signal PCTL received from the control circuit 450.

In an example embodiment, the data input/output circuit 420 is coupled to the page buffer circuit 410 through data lines DLs. During the program operation, the data input/output circuit 420 may receive program data DTA from the storage controller 300 and provide the program data DTA to the page buffer circuit 410 based on the column address C_ADDR received from the control circuit 450. During the read operation, the data input/output circuit 420 may provide read data DTA, which is stored in the page buffer circuit 410, to the storage controller 300 based on the column address C_ADDR received from the control circuit 450.

Figure 15:
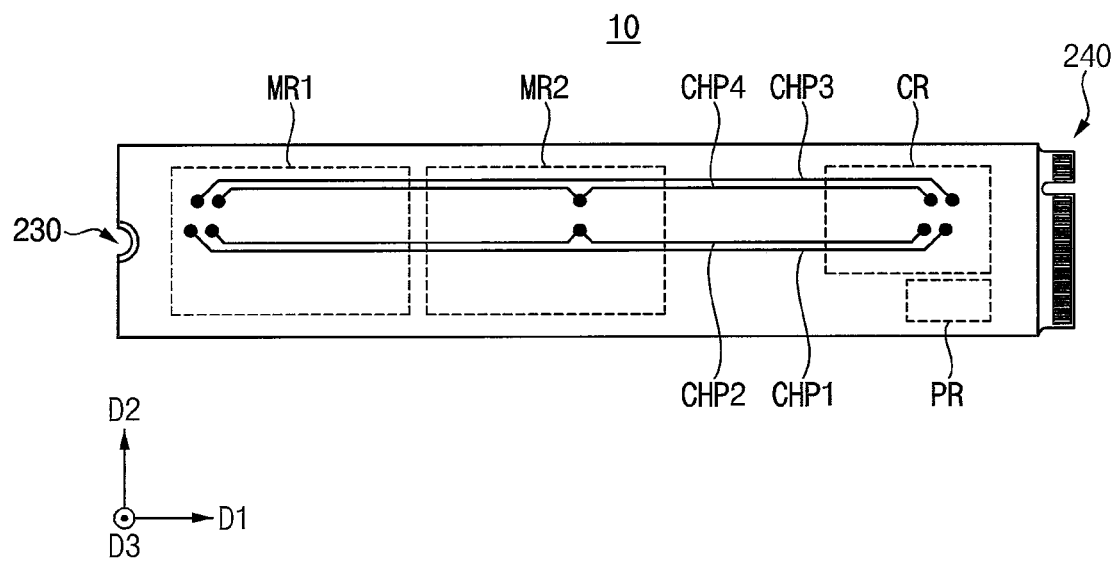
FIGS. 15 and 16 are a plan view and a cross-sectional view illustrating a printed circuit board (PCB) on which a storage device is mounted according to example embodiments, respectively.
Figure 16:
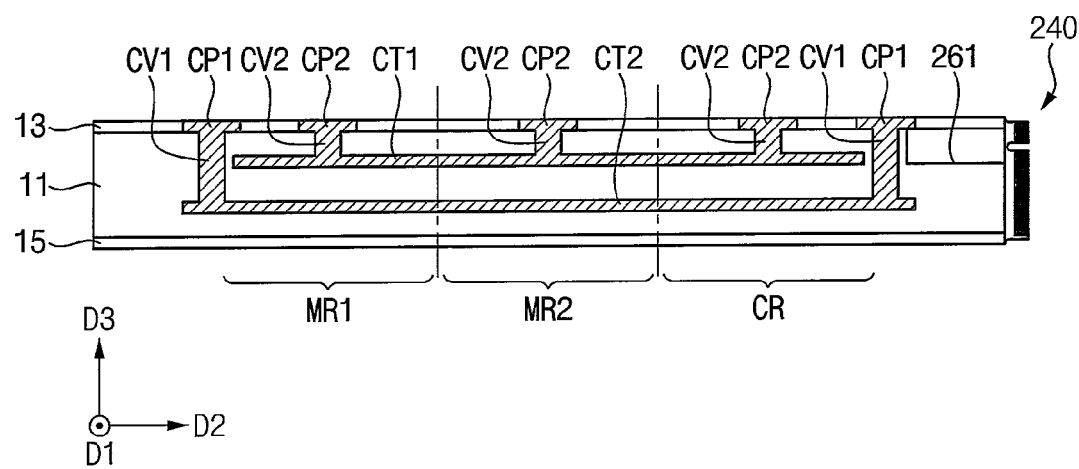

FIGS. 15 and 16 are a plan view and a cross-sectional view, respectively, illustrating a printed circuit board (PCB) on which a storage device is mounted according to example embodiments.

Referring to FIGS. 15 and 16, a PCB 10 is illustrated as including a first channel pattern CHP1, a second channel pattern CHP2, a third channel pattern CHP3, and a fourth channel pattern CHP4.

The PCB 10 may include a body layer 11, a top protection layer 13, and a bottom protection layer 15. The PCB 10 may include wiring units, and the wiring units on the PCB 10 may be electrically connected to the storage controller 300 and the nonvolatile memory devices 400a~400k. In addition, the PCB 10 may include a connector 240. The PCB 10 may be electrically connected to a module substrate, a system board, a main board, etc. through the connector 240, on which the PCB is mounted.

In the body layer 11, the wiring units of a multi-layer or a single layer may be formed, and through the wiring units, the PCB 10 may be electrically connected to storage controller 300 and the nonvolatile memory devices 400a~400k. The top and bottom protection layers 13 and 15 may perform a protection function and may be formed with solder resist.

In addition, the body layer 11 may be generally implemented by pressing to a certain thickness a high polymer material such as thermosetting resin, epoxy resin or phenolic resin such as flame retardant 4 (FR-4), bismaleimide triazine (BT), and Ajinomoto build-up film (ABF), forming the pressed result into a thin layer, coating copper foil on both sides of the formed thin layer, and forming through patterning the wiring units which are transmission paths of electrical signals.

In addition, in some example embodiments, the PCB 10 may be provided as a single layer PCB forming the wirings on one side thereof and in other example embodiments as a double layer PCB forming the wirings on both sides thereof. In addition, the number of thin layers may be 3 or more and may be formed by using an insulating material such as prepreg, and a PCB including multi-layer wirings may be implemented by forming 3 or more wiring layers according to the number of formed thin layers.

The PCB 10 may be a substrate on which the semiconductor package is mounted thereon and include an insulating layer and the wiring unit. The wiring unit may include a first conductive trace CT1 and a second conductive trace CT2, which are formed in the insulating layer, and may include one or more first conductive vias CV1 passing through the insulating layer and connected to the first conductive trace CT1, and one or more second conductive vias CV2 passing through the insulating layer and connected to the second conductive trace CT2.

The first channel pattern CHP1 may be a first wiring unit and may include the first conductive trace CT1 extending in the second direction D2, the first conductive via CV1 extending in the third direction D3, and a first conductive pad CP1 formed on a top side of the first conductive via CV1.

The second channel pattern CHP2 may be a second wiring unit and may include the second conductive trace CT2 extending in the second direction D2, the second conductive via CV2 extending in the third direction D3, and a second conductive pad CP2 formed on a top side of the second conductive via CV2.

In some example embodiments, the reason why the second channel pattern CHP2 formed in a daisy chain manner/topology has different wiring lengths in a first mounting area MR1 and a second mounting area MR2 is because providing a method for compensating for signal loss in only any one of the first mounting area MR1 and the second mounting area MR2 may be desired.

In some example embodiments, a semiconductor package in the first mounting area MR1 may be electrically connected to the first through fourth channel patterns CHP1 through CHP4, and a semiconductor package in the second mounting area MR2 may be electrically connected to the second and third channel patterns CHP2 and CHP3.

Although only the first and second channel patterns CHP1 and CHP2 are illustrated in FIG. 16 for convenience of description, the first and fourth channel patterns CHP1 and CHP4 may be configured to be substantially the same as each other in a point to point manner/topology (or may be configured as one channel pattern group), and the second and third channel patterns CHP2 and CHP3 may be configured to be substantially the same as each other in a daisy chain manner/topology (or may be configured as another channel pattern group). The second channel pattern CHP2 and the third channel pattern CHP3 may be formed to face each other and adjacent to each other, and the first channel pattern CHP1 and the fourth channel pattern CHP4 may be formed to face each other with the second channel pattern CHP2 and the third channel pattern CHP3 therebetween. Since the second and third channel patterns CHP2 and CHP3 are formed in a daisy chain manner/topology and have branching points in the middle thereof, the branching points may be configured in an arrangement shape as described above, so that the branching points do not overlap the first and fourth channel patterns CHP1 and CHP4, in other words, for easiness of circuit design.

In FIG. 16, the first channel pattern CHP1 is illustrated as being formed on a layer closer to the bottom protection layer 15 than the second channel pattern CHP2. However, the second channel pattern CHP2 may be formed on a layer closer to the bottom protection layer 15 than the first channel pattern CHP1, and in some example embodiments, the first channel pattern CHP1 and the second channel pattern CHP2 may also be formed on the same layer.

The storage controller area CR and the first mounting area MR1 may include all of the first and second conductive vias CV1 and CV2 and the first and second conductive pads CP1 and CP2, which are included in the first through fourth channel patterns CHP1 through CHP4, and the second mounting area MR2 may include only a portion of the first and second conductive vias CV1 and CV2 and the first and second conductive pads CP1 and CP2 which are included in the second and third channel patterns CHP2 and CHP3.

In addition, the PCB 10 may include a power supply area PR next to the storage controller area CR. The storage controller area CR and the connector 240 may be connected through a conductive pattern 261.

Figure 17:
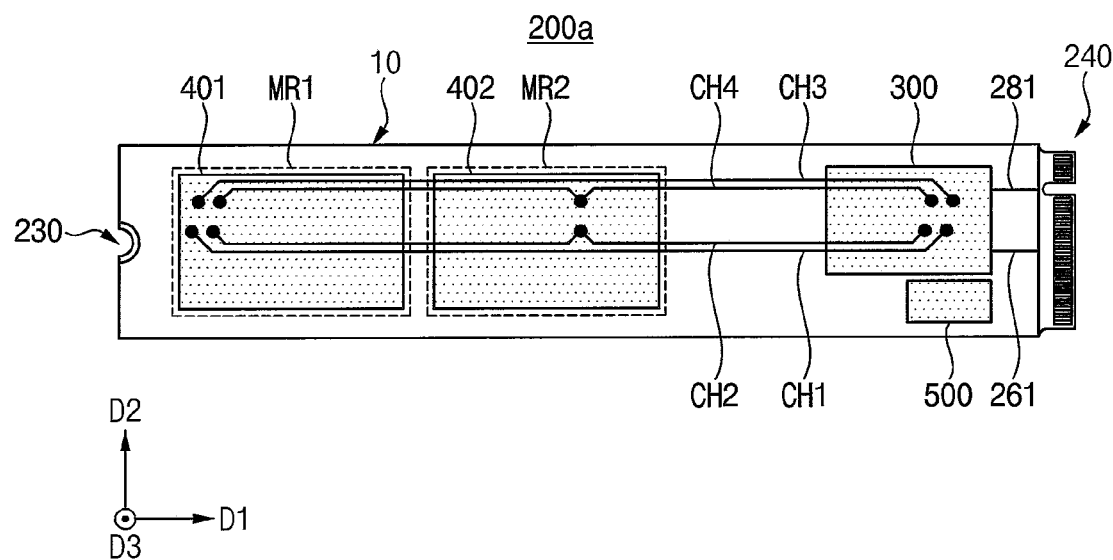
FIGS. 17 and 18 are a plan view and a cross-sectional view illustrating a storage device according to example embodiments.
Figure 18:
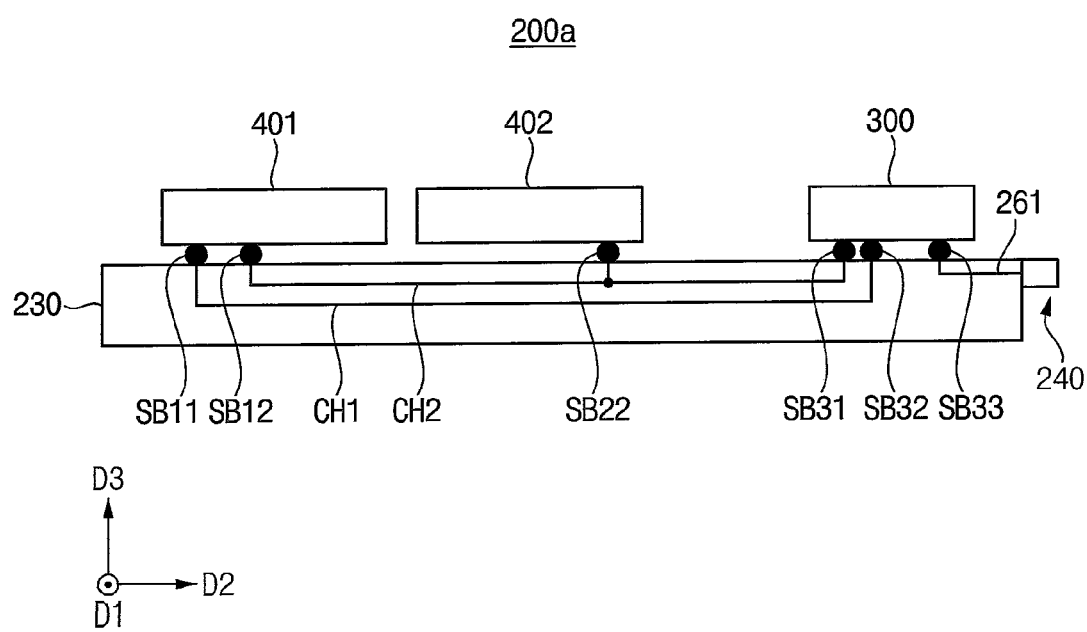

FIGS. 17 and 18 are a plan view and a cross-sectional view, respectively, illustrating a storage device according to example embodiments.

Referring to FIGS. 17 and 18, there is provide a storage device 200a in which a first memory package 401 may be mounted only in the first mounting area MR1 of the PCB 10, a second memory package 402 may be mounted only in the second mounting area MR2 of the PCB 10, the first and fourth channels CH1 and CH4 are connected to the first memory package 401 and the second and third channels CH2 and CH3 are connected to the second memory package 402.

Each of the first memory package 401 and the second memory package 402 may be formed by stacking at least some of the nonvolatile memory devices 400a~400k of the storage system of FIG. 1. The first memory package 401 may be connected to the first and second channels CHI and CH2 through solder balls SB11 and SB12, the second memory package 402 may be connected to the second channel CH2 through solder ball SB22 and the storage controller 300 may be connected to the first and second channels CHI and CH2 through solder balls SB31 and SB32.

Conductive patterns 261 and 281 connecting the connector 240 and the storage controller 300 may be provided in the PCB 10. The conductive pattern 261 may be connected to the storage controller 300 through a solder ball SB33.

FIG. 19 is a block diagram illustrating an example of a storage device of the storage system of FIG. 1 according to example embodiments.

Referring to FIG. 19, a storage device 200b may include a storage controller 300 and a package 400 including a plurality of nonvolatile memory devices (NVM) 400a~400k provided on the PCB 10.

The storage controller 300 and the nonvolatile memory devices 400a~400k may be electrically coupled to each other through a transmission line 50. The storage controller 300 may transmit a command signal and an address signal to the nonvolatile memory devices 400a~400k and may exchange data with the nonvolatile memory devices 400a~400k through the transmission line 50. The transmission line 50 may include the signal lines 361~36m and the signal line 355.

The storage controller 300 may include the first delay circuit and the first register and at least a portion of the nonvolatile memory devices 400a~400k may include the second delay circuit and the second register, as discussed above. Therefore, the storage controller 300 may delay the data signals such that at least some first edges of windows of data signals are desynchronized by first skew offsets which are different from one another and may transmit the delayed data signals to one of the nonvolatile memory devices 400a~400k through the transmission line 50. Therefore, the storage controller 300 may reduce crosstalk occurring in the data signals on the transmission line 50.

The storage device 200b may further include the conductive pattern, provided as a portion of the PCB 10, which connects the connector 240 and the storage controller 300.

Although in FIG. 19, the storage device 200b is illustrated as including the storage controller 300 and the package 400 including a plurality of nonvolatile memory devices 400a~400k, the storage device 200b may further include other components such as a power supply circuit and/or a volatile memory device, etc.

The storage device 200b may include flash memory based data storage media such as a memory card, a smart card, a universal serial bus (USB) memory, a solid state drive (SSD).

The package 400 may include the nonvolatile memory devices 400a~400k. If the nonvolatile memory devices 400a~400k are contained in the package 400 in the form of multi-stack chip, the stacked nonvolatile memory devices 400a~400k are connected to the storage controller 300 through the same channel.

Figure 20:
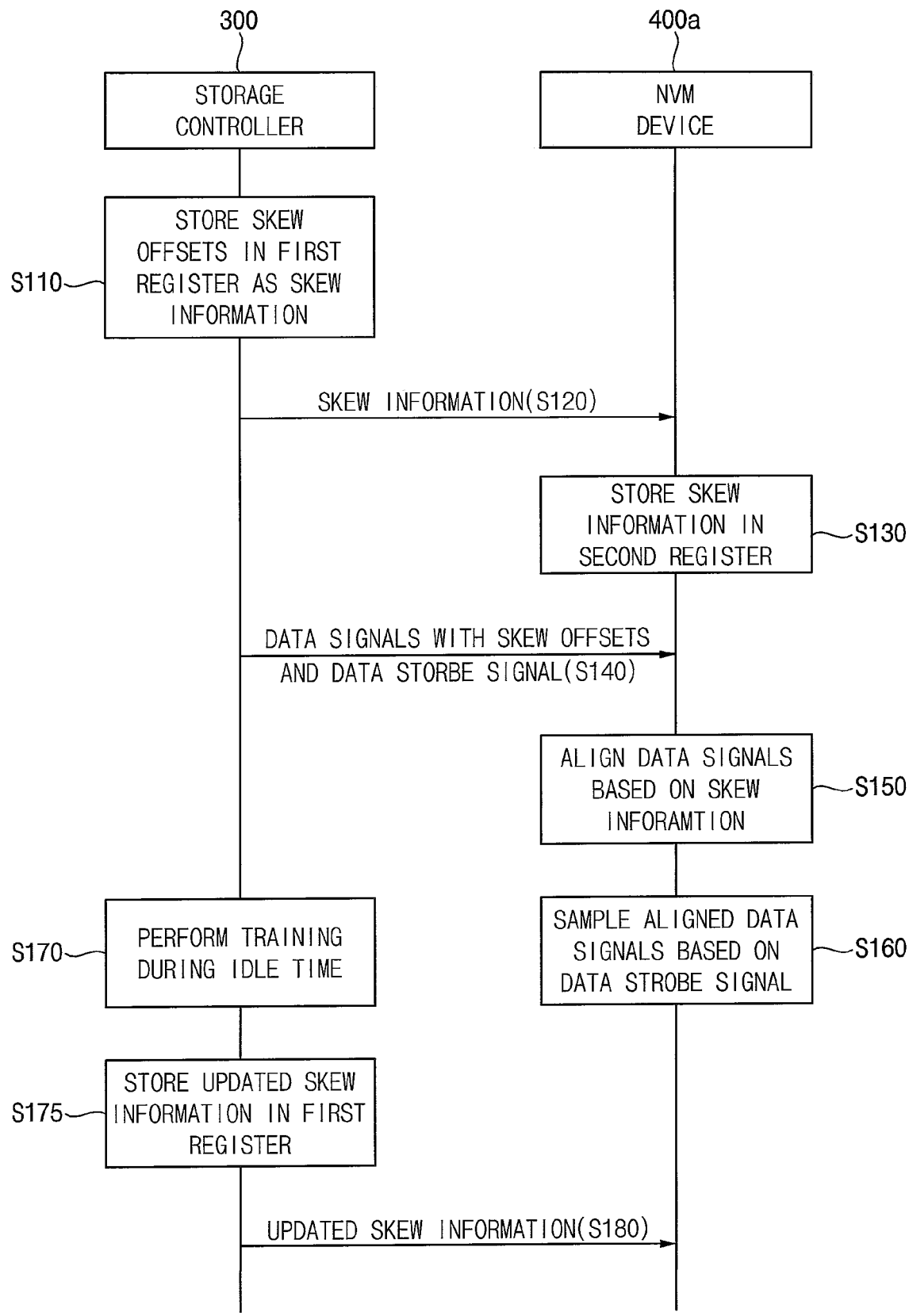
FIG. 20 illustrates an example of operation of a storage device according to example embodiments.

FIG. 20 illustrates an example of operation of a storage device according to example embodiments.

Referring to FIGS. 3 through 18 and 20, there is provided a method of operating the storage device 200 which includes at least one nonvolatile memory device (NVM) 400a and the storage controller 300 to control the at least one nonvolatile memory device (NVM) 400a.

According to the method, the storage controller 300 stores first skew offset OFS1 associated with data signals DQ1~DQm to be transmitted to the at least one nonvolatile memory device (NVM) 400a through signal lines 361~36m in the first register 390 as skew information SKI (operation S110).

The storage controller 300 transmits the skew information SKI to the at least one nonvolatile memory device (NVM) 400a (operation S120).

The at least one nonvolatile memory device (NVM) 400a stores the skew information SKI received from the storage controller 300 in the second register 405 (operation S130).

The first delay circuit 370 in the storage controller 300 delays original data signals DT1~DTm by different delay amounts based on the skew information SKI stored in the first register 390 to output data signals DQ1~DQm. The storage controller 300 transmits the data signals DQ1~DQm having the first skew offsets and a data strobe signal DQS in parallel to the one nonvolatile memory device (NVM) 400a through signal lines 361~36m and 355 (operation S140).

The second delay circuit 480 in the at least one nonvolatile memory device (NVM) 400a aligns the data signals based on the stored skew information SKI (operation S150). For example, the second delay circuit 480 delays the data signals DQ1~DQm by second skew offsets, stored in the second register 405, for cancelling the first skew offsets to align the data signals DQ1~DQm and outputs the original data signals DT1~DTm.

The sampling circuit 490 in the at least one nonvolatile memory device (NVM) 400a samples the aligns the data signals based on the data strobe signal (operation S160). For example, the sampling circuit 490 samples the original data signals DT1~DTm based on the data strobe signal DQS (operation S160) and provides the sampled data signal to an inside of the at least one nonvolatile memory device (NVM) 400a.

During an idle interval of the storage device 200, the storage controller 300 performs training to search skew offset for minimizing crosstalk occurring among from training patterns on the signal lines 361~36m such that an eye window of the training patterns is increased (operation S170), and the storage controller 300 updates the skew information SKI stored in the first register 390 (operation S175).

The storage controller 300 transmits the updated skew information to the at least one nonvolatile memory device (NVM) 400a (operation S180) and the at least one nonvolatile memory device (NVM) 400a stores the updated skew information in the second register 405.

Figure 21:
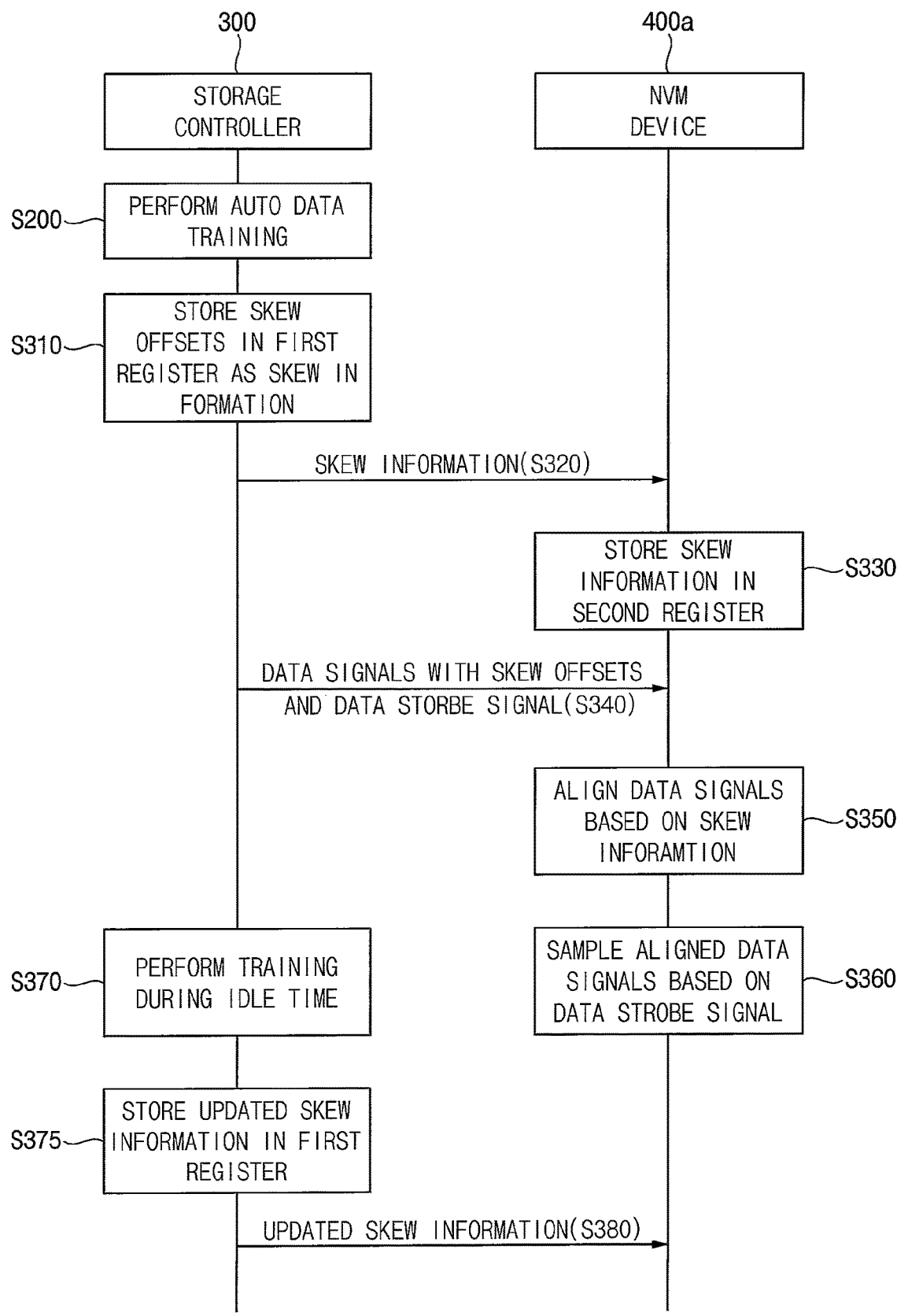
FIG. 21 illustrates an example of operation of a storage device according to example embodiments.

FIG. 21 illustrates an example of operation of the storage device according to example embodiments.

Referring to FIGS. 3 through 18, 20 and 21, there is provided a method of operating a storage device 200 which includes at least one nonvolatile memory device (NVM) 400a and a storage controller 300 to control the at least one nonvolatile memory device (NVM) 400a.

A method of FIG. 21 includes operation S200 and operations S310, S320, S330, S340, S350, S360, S370, S375 and S380 and each of the operations S310, S320, S330, S340, S350, S360, S370, S375 and S380 is substantially the same as the operations S110, S120, S130, S140, S150, S160, S170, S175 and S180, respectively, in FIG. 20. Therefore, detailed description on the operations S310, S320, S330, S340, S350, S360, S370, S375 and S380 will be omitted for conciseness.

The storage controller 300 performs auto data training (operation S200). For example, the storage controller 300 performs training by transmitting training patterns to the at least one nonvolatile memory device (NVM) 400a through the signal lines 361~36m, and searching skew offset for minimizing crosstalk (that is, maximizing eye) occurring among from the training patterns on the signal lines 361~36m such that eye window of the training patterns is equal to or greater than a reference value and stores the skew offsets in the first register 390 as the skew information SKI based on a result of the training (operation S310).

The storage controller 300 may perform training sequentially on the training patterns on the signal lines 361~36m and may store the skew offsets in the first register 390 as the skew information SKI based on a result of the training which is sequentially performed.

For example, it is assumed that the data signals DQ1~DQm are transmitted in parallel to the nonvolatile memory device (also referred to as 'at least one semiconductor memory device') through the signal lines 361~36m.

Since a number of the data signals DQ1~DQm and a number of the signal lines 361~36m correspond to m, a resolution of skew offset among from the data signals DQ1~DQm is set to 360 degrees/m=A.

The skew offset of the training pattern with respect to the data signal DQ1 is set to '0', skew offset of the training pattern with respect to the data signal DQ2 is sequentially changed from 'A' to 'm*A', and a skew offset that makes an eye window of the training pattern with respect to the data signal DQ2 on the signal line 362 a maximum value is stored in the first register 390.

With the skew offset of the data signal DQ2 being fixed, skew offset of the training pattern with respect to the data signal DQ3 is sequentially changed from 'A' to 'm*A', and a skew offset that makes an eye window of the training pattern with respect to the data signal DQ3 on the signal line 363 a maximum value is stored in the first register 390.

The above mentioned process is sequentially performed on the data signals DQ4~DQm, and the training ends when skew offsets of the data signals DQ2~DQm are stored in the first register 390. That is, the skew offsets of the data signals DQ1~DQm may be sequentially determined and may be stored in the first register 390. In addition, the eye window of the training pattern with respect to each of the data signals DQ2~DQm may be measured by the processor 310 in FIG. 3.

When the data signals DQ1~DQm are to be transmitted to the nonvolatile memory device 400a, the data signals DQ1~DQm are desynchronized with respect to one another by the skew offsets determined in the training and thus crosstalk that may occur in the data signals DQK~DQm on the signal lines 361~36m may be reduced.

Figure 22:
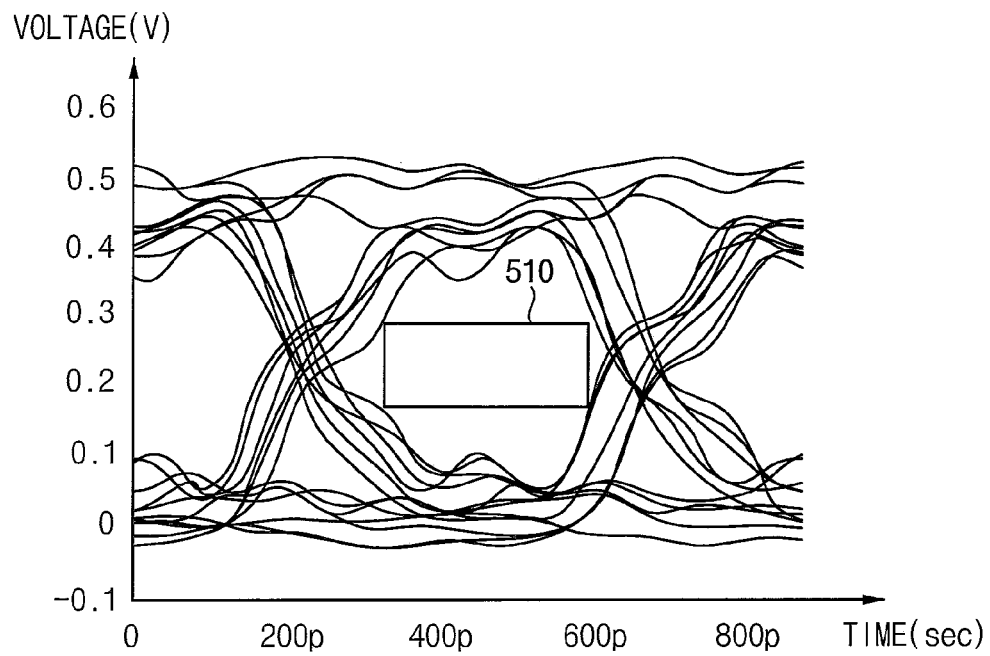
FIGS. 22 and 23 are diagrams for explaining operation of a storage device according to example embodiments.
Figure 23:
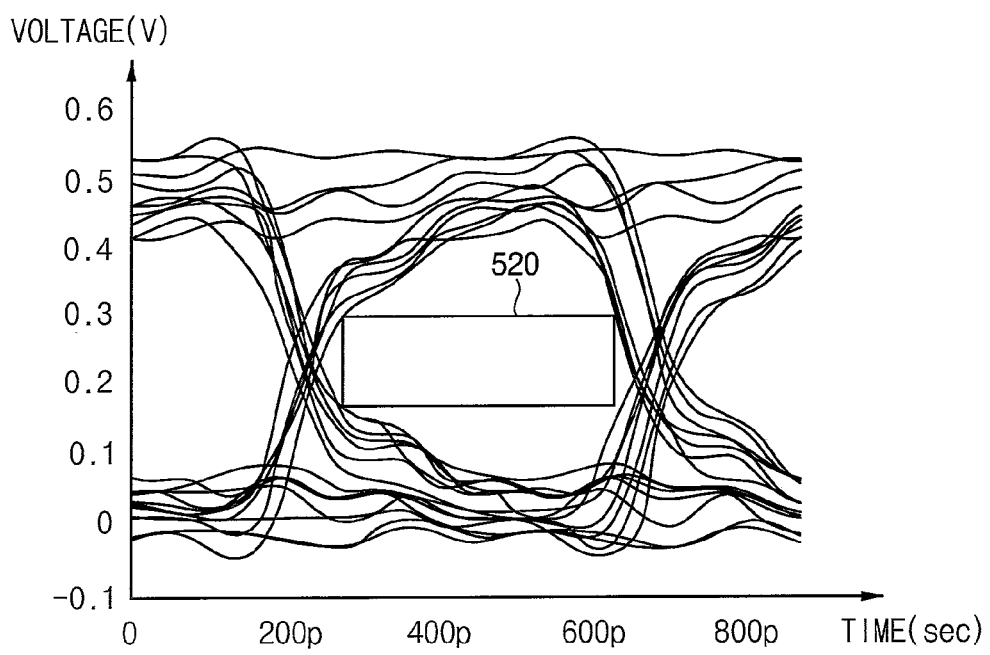

FIGS. 22 and 23 are diagrams for explaining operation of a storage device according to example embodiments.

FIG. 22 illustrates an eye diagram of the data signals DQ1~DQm transmitted in parallel from the storage controller 300 when the storage controller 300 in FIG. 4 does not adjust the skew offsets of the data signals DQ1~DQm. FIG. 23 illustrates an eye diagram of the data signals DQ1~DQm transmitted in parallel from the storage controller 300 when the storage controller 300 in FIG. 4 adjusts the skew offsets of the data signals DQ1~DQm.

In FIGS. 22 and 23, a horizontal axis denotes a time and a vertical axis denotes a voltage level of the data signal.

Referring to FIGS. 4, 22 and 23, it is noted that an eye window 520 in which the storage controller 300 adjusts the skew offsets of the data signals DQ1~DQm such that the data signals DQ1~DQm are desynchronized is greater than an eye window 510 in which storage controller 300 does not adjust the skew offsets of the data signals DQ1~DQm. For example, an area of the eye window 520 may be greater than an area of the eye window 510. As another example, a length of the eye window 520 in the x-axis may be greater than a length of the eye window 510 in the x-axis.

According to example embodiments, when the storage controller 300 adjusts the skew offsets of the data signals DQ1~DQm transmitted in parallel such that the data signals DQ1~DQm are desynchronized, signal integrity of the data signals DQ1~DQm output form the storage controller 300 is enhanced.

Figure 24:
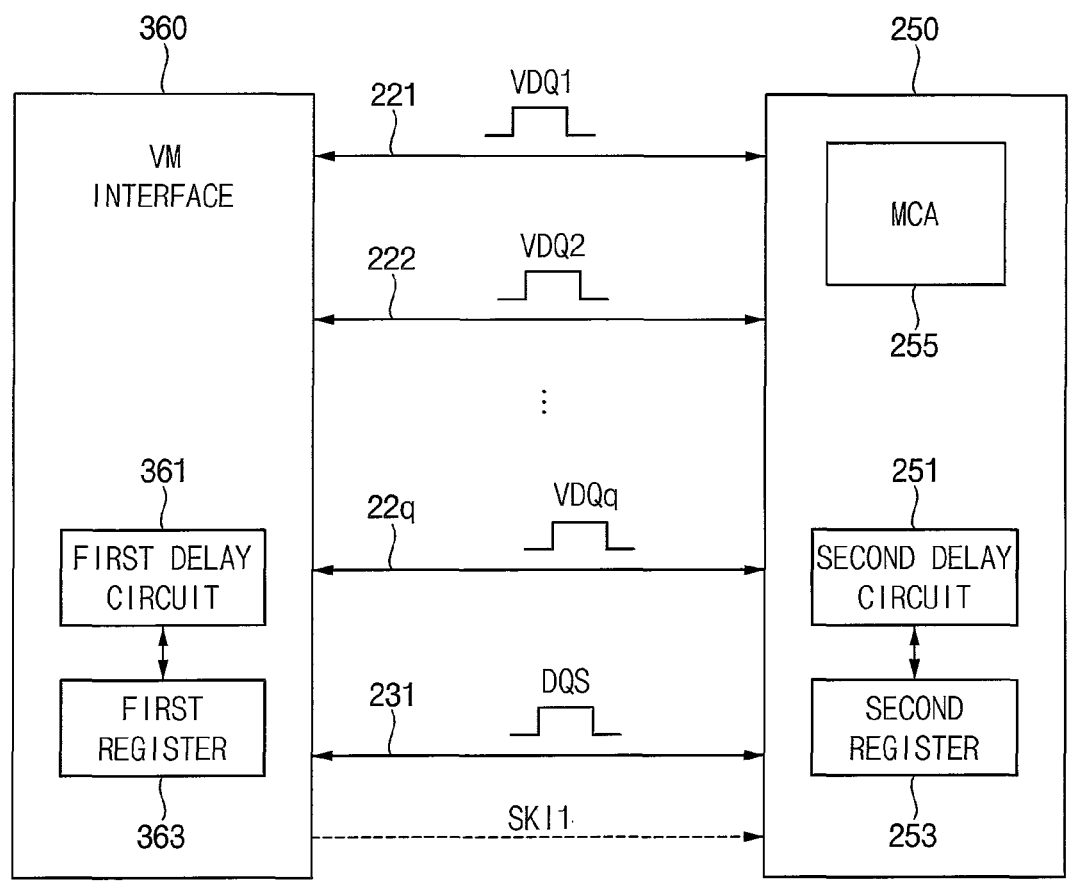
FIG. 24 illustrates a volatile memory device of the storage system of FIG. 1 and a volatile memory interface of the storage controller of FIG. 3 according to example embodiments.

FIG. 24 illustrates the volatile memory device 250 of the storage system of FIG. 1 and the volatile memory interface 360 in the storage controller of FIG. 3 according to example embodiments.

Referring to FIG. 24, the volatile memory interface 360 may exchange data signals VDQ1~VDQq (q is an integer greater than three) with volatile memory device 250 through a plurality of signal lines 221-22q and may exchange a data strobe signal DQS1 with the volatile memory device 400a through a signal line 231. The signal lines 221-22q and the signal line 231 are formed in the PCB and connect the storage controller 300 and the volatile memory device 250. Therefore, as described with reference to FIG. 4, gap between the signal lines 221-22q is reduced, a crosstalk or a noise due to the crosstalk may occur in the data signals VDQ1~VDQq on the signal lines 221-22q if the data signals VDQ1~VDQq on the signal lines 221-22q have same edges.

For reducing the crosstalk, the volatile memory interface 360 includes a first delay circuit 361 and a first register 363 and the volatile memory device 250 includes a second delay circuit 251 and a second register 253. The volatile memory interface 360 may store skew offsets associated with the data signals VDQ1~VDQm as skew information SKI1 in the first register 363 and may transmit the skew information SKI1 to the volatile memory device 250.

Therefore, the volatile memory interface 360 and the volatile memory device 250 may generate the skews among from the data signals VDQ1~VDQm intentionally and may reduce crosstalk occurring among from the data signals VDQ1~VDQ on the signal lines 221~22q. The volatile memory device 250 may include a memory cell array (MCA) 255 having a plurality of volatile memory cells coupled to word-lines and bit-lines.

According to example embodiments, the storage controller including the delay circuit, delays the data signals to be transmitted to the semiconductor memory device through the signal lines such that at least some of first edges of the data signals are desynchronized by the skew offsets and transmits the data signals to the semiconductor memory device. The semiconductor memory device receives the skew information associated with the skew offset, and aligns the data signals by cancelling the skew offsets based on the skew information. Therefore, the storage device may increase signal integrity and enhance performance by reducing the crosstalk occurring in the data signals on the signal lines.

Figure 25:
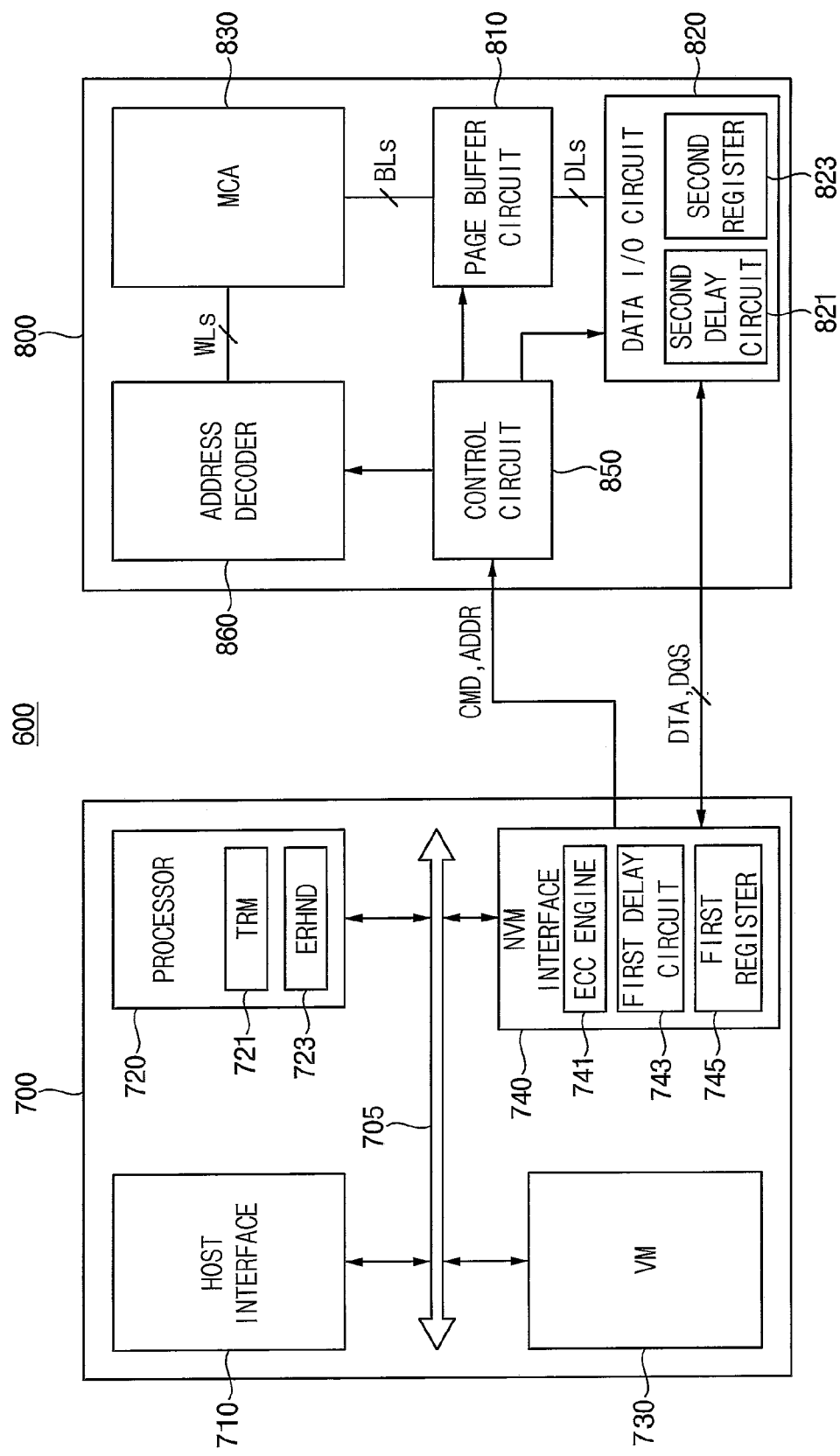
FIG. 25 is a block diagram illustrating a storage device according to example embodiments.

FIG. 25 is a block diagram illustrating a storage device according to example embodiments.

Referring to FIG. 25, a storage device 600 may include a storage controller 700 and a nonvolatile memory device 800. The nonvolatile memory device 800 may be configured to perform a write operation, a read operation, or an erase operation under control of the storage controller 700.

The storage controller 700 may include a host interface 710, a processor 720, a volatile memory device (VM) 730 and a nonvolatile memory (NVM) interface 740 which are connected via a bus 705.

The host interface 710 may communicate with an external host and may transfer requests from the host to the processor 720. The processor 720 may include one or more microprocessors and may control an overall operation of the storage controller 700. The processor 720 may include a training manager (TRM) 721 and an error handler (ERHND) 723. The training manager 721 and the error handler 723 may be implemented in the form of circuits of the processor 720 and/or in the form of codes executable by the circuits.

The volatile memory device (VM) 730 may be used as a working memory of the processor 720. The volatile memory device 730 may also be used as a buffer memory or a cache memory between the external host and the nonvolatile memory device 800.

The nonvolatile memory (NVM) interface 740 may operate in response to the requests from the processor 720. The nonvolatile memory interface 740 may transmit the command CMD and the address ADDR to the nonvolatile memory device 800 through control lines and may exchange the data DTA and a data strobe signal DQS with the nonvolatile memory device 800 through signal lines.

The nonvolatile memory (NVM) interface 740 may include an ECC engine 741, a first delay circuit 743 and a first register 745. The ECC engine 741 performs operation similar with operation of the ECC engine 320 in FIG. 3, the first delay circuit 743 has a similar structure and performs operation similar with the first delay circuit 370 in FIG. 4 and the first register 745 has a similar structure and performs operation similar with the first register 390 in FIG. 4, and thus repeated description thereof is omitted for conciseness.

The nonvolatile memory device 800 may include a memory cell array (MCA) 830, an address decoder 860, a page buffer circuit 810, a data input/output (I/O) circuit 820 and a control circuit 850.

The memory cell array (MCA) 830 is coupled to the address decoder 860 through a string selection line (not shown), a plurality of word lines WLs, and a ground selection line (not shown). In addition, the memory cell array 830 is coupled to the page buffer circuit 810 through a plurality of bit lines BLs. The memory cell array 830 includes a plurality of memory cells coupled to the plurality of word lines WLs and the plurality of bit lines BLs.

The data input/output circuit 820 is coupled to the page buffer circuit 810 through data lines DLs. The data input/output circuit 820 may include a second delay circuit 821 and a second register 823. The second delay circuit 821 has a similar structure and performs operation similar with the second delay circuit 480 in FIG. 4 and the second register 823 has a similar structure and performs operation similar with the second register 405 in FIG. 4.

The control circuit 850 may control operation of the nonvolatile memory device 800 based on the command CMD and the address ADDR received from the nonvolatile memory interface 740 and the data I/O circuit 820 exchange the data DTA and the data strobe signal DQS with the nonvolatile memory interface 740.

Figure 26:
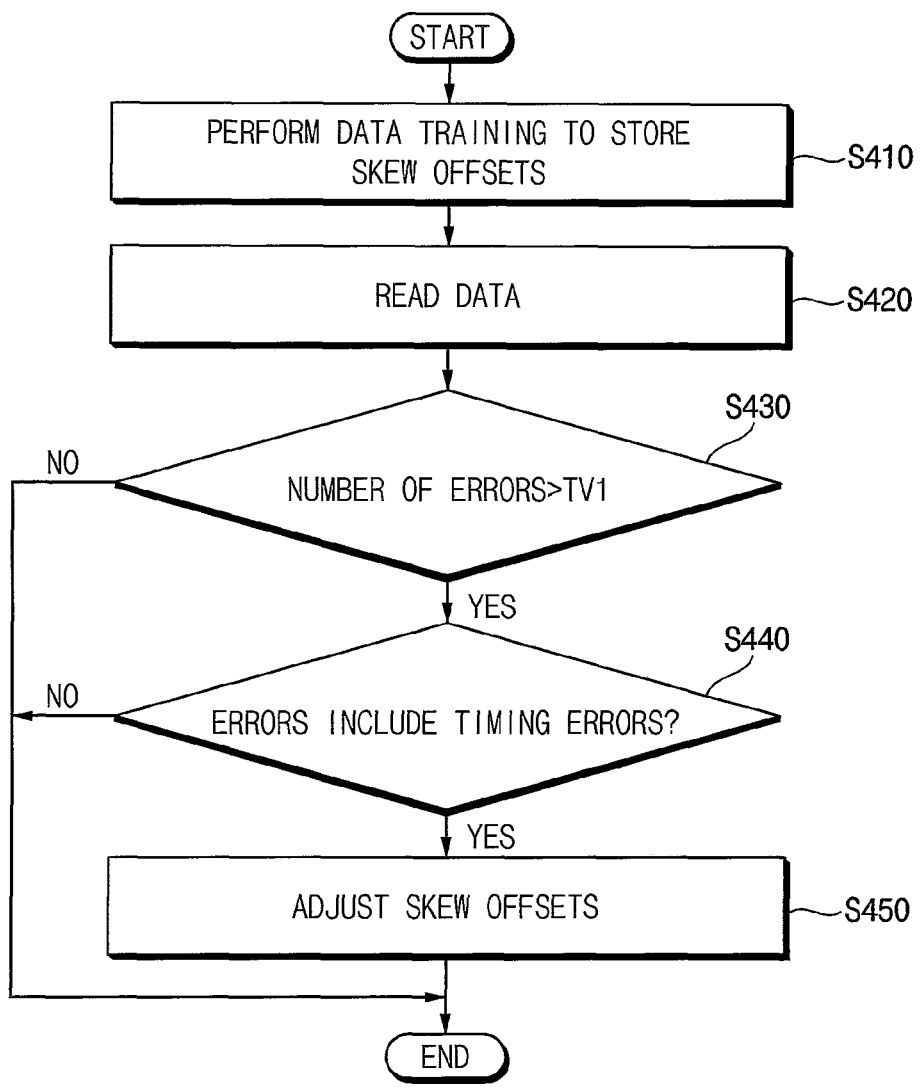
FIG. 26 is a flow chart illustrating operation of the storage device of FIG. 26 according to example embodiments.

FIG. 26 is a flow chart illustrating operation of the storage device of FIG. 26 according to example embodiments.

Referring to FIGS. 25 and 26, when the storage device 600 is booted or initialized, the processor 720 (i.e., the training manager 721) may perform data training to store skew offsets (operation S410). For example, the processor 720 may transmit training patterns to the nonvolatile memory device 800 through the signal lines, may perform training to search for skew offsets for minimizing crosstalk occurring among from the training patterns on the signal lines, and may store the skew offsets in the first register 745 as a skew information based on a result of the training. The training sequence may be the same as the training sequence described with reference to FIG. 21.

The nonvolatile memory interface 740 delays the data signals such that the data signals in write data are desynchronized by the skew offsets and transmits the data signals to the nonvolatile memory device 800.

The storage controller 700 reads the data including the data signals from the nonvolatile memory device 800 (operation S420).

The processor 720 determines whether the number of errors of the read data is greater than a first threshold value TV1 (operation S430). The processor 720 may detect errors of the read data by using the ECC engine 741.

When the number of errors is greater than the first threshold value TV1 (YES in S430), the processor 720 (the error hander 723) determines whether the errors include timing errors arising from a variation of the signal transmission timings (operation S440). For example, the delay amounts of the VCDL of the first delay circuit 743 may vary over time or with a change of a temperature after the delay amounts of the VCDL of the first delay circuit 743 are locked (or fixed). The processor 720 may determine whether a timing error arising from the variation of the delays, that is, the variation of the signal transmission timings exists.

When it is determined that the errors include the timing errors (YES in S440), the processor 720 may adjust the skew offsets (operation S450). For example, the processor 720 may perform a training operation to adjust the skew offsets. The adjusted skew offsets may be stored in the first register 745 and the second register 823 as updated skew information.

When the number of errors is not greater than the first threshold value TV1 (NO in S430), or when it is determined that the errors do not include the timing errors (NO in S440), the processor 720 may terminate the process of FIG. 26.

Figure 27:
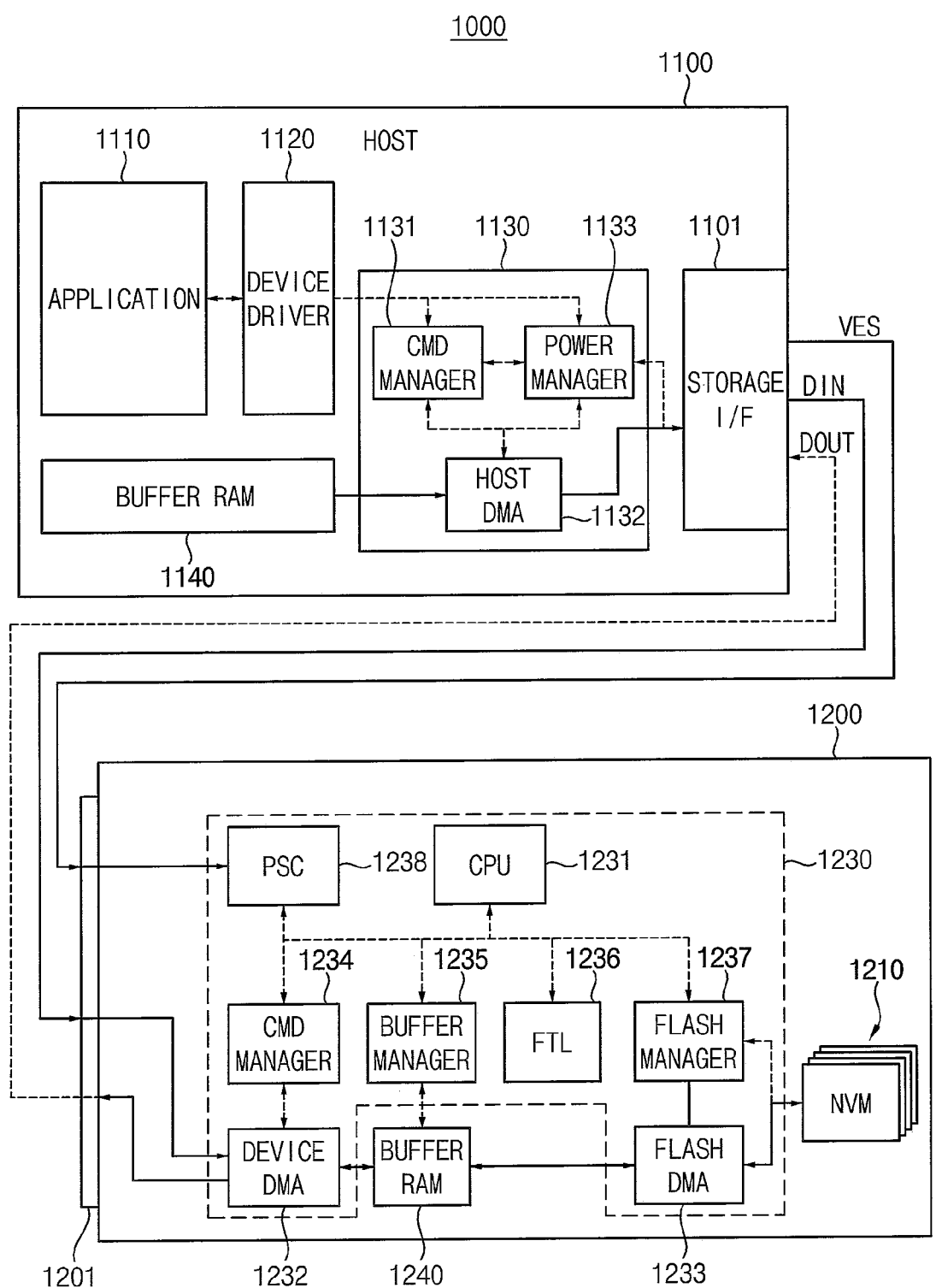
FIG. 27 is a block diagram illustrating a storage system according to example embodiments.

FIG. 27 is a block diagram illustrating a storage system according to example embodiments.

Referring to FIG. 27, a storage system 1000 may include a host 1100 and a storage device 1200. The storage device 1200 may be connected to the host 1100 through a connector 1201 including a plurality of connection terminals and may communicate with the host 1100. The connector 1201 may include a signal connector and a power connector as described with reference to FIG. 1

The host 1100 includes an application 1110, a device driver 1120, a host controller 1130, and buffer RAM 1140. The host controller 1130 includes a command (CMD) manager 1131, a host direct memory access (DMA) 1132, and a power manager 1133.

In operation, a system level command (e.g., a write command) is generated by the application 1110 and device driver 1120 of the host 1100 and is then provided to the command manager 1131 of the host controller 1130. The command manager 1131 may be used to generate a corresponding storage device command (i.e., a corresponding command or set of commands consistent with a protocol being implemented by the storage system 1000) that is provided to the storage device 1200 using the device driver 1120. The command generated by the command manager 1131 may also be provided to the host DMA 1132 which sends the command to the storage device 1200 via a storage interface 1101.

The storage device 1200 includes flash memory devices (NVM) 1210, a device controller 1230, and a buffer random access memory (RAM) 1240. The device controller 1230 may include a Central Processing Unit (CPU) 1231, a device DMA 1232, a flash DMA 1233, a command (CMD) manager 1234, a buffer manager 1235, a flash translation layer (FTL) 1236, a flash manager 1237, and a power supply circuit (PSC) 1238. The power supply circuit 1238 may generate operating voltages based on a power supply voltage VES from the host 1100.

The flash memory devices 1210, the device controller 1230, and the buffer RAM 1240 may be provided on a PCB.

A command transferred from the host 1100 to storage device 1200 may be provided to the device DMA 1232 via the connector 1201.

The device DMA 1232 may then communicate the received command to the command manager 1234. The command manager 1234 may be used to allocate memory space in the buffer RAM 1240 in order to receive corresponding write data via the buffer manager 1235. Once the storage device 1200 is ready to receive the write data, the command manager 1234 may communicate a transmission "ready" signal to the host 1100.

Upon receiving the transmission ready signal, the host 1100 will communicate the write data to the storage device 1200. The write data may be sent to the storage device 1200 using the host DMA 1132 and host interface 1101. The storage device 1200 may then store the received write data in the buffer RAM 1240 using the device DMA 1232 and buffer manager 1235. The write data stored in the buffer RAM 1240 may then be provided to the flash manager 1237 via the flash DMA 1233. The flash manager 1237 may be used to program the write data according to addresses for the flash memory 1210 derived from an address mapping table by the flash translation layer 1236.

Once the transfer and programming of the write data is complete, the storage device 1200 may send a response to the host 1100 informing the host 1100 that the write command has been successfully executed. Based on the received response signal, the host 1100 indicates to the device driver 1120 and application 1110 that the command is complete, and will thereafter terminate execution of the operation corresponding to the command.

As described above, the host 1100 and storage device 1200 may exchange data, corresponding commands and/or control signal(s) (e.g., the ready and response signals) via data lines of the data segment (e.g., data lines DIN and DOUT).

The device controller 1230 exchanges data signals with each of the nonvolatile memory devices (NVM) 1210 through a plurality of signal lines, and the flash DMA 1233 includes a delay circuit and a register according to example embodiments. The flash DMA 1233 stores skew offsets, delays the data signals such that at least some of edges of the data signals are desynchronized by the skew offsets and transmits the data signals to each of the nonvolatile memory devices 1210. Therefore, the storage device 1200 may reduce crosstalk occurring in signal lines connecting the device controller 1230 and each of the nonvolatile memory devices 1210 and may increase signal integrity.

A storage device or a storage system according to example embodiments may be packaged using various package types or package configurations.

The present disclosure may be applied to various electronic devices including storage devices.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present disclosure as determined in the claims.

What is claimed is:

1. A storage device comprising:
   at least one semiconductor memory device configured to receive write data based on a data strobe signal and a plurality of data signals, and configured to output read data based on the data strobe signal and the plurality of data signals; and
   a storage controller configured to transmit the data strobe signal and the plurality of data signals in parallel to the at least one semiconductor memory device through a plurality of signal lines,
   wherein the storage controller includes a first delay circuit configured to individually delay each of the plurality of data signals such that at least some edges of windows of the plurality of data signals on the plurality of signal lines are desynchronized by first skew offsets which are different from one another.

2. The storage device of claim 1, wherein:
   the storage controller further includes a first register configured to store the first skew offsets as skew information;
   each of the plurality of data signals has a window defined by a first edge and a second edge;
   the at least some edges correspond to a portion of the first edges; and
   the first skew offsets correspond to differences of the first edges of the plurality of data signals and the differences of the first edges reduce crosstalk occurring among the plurality of data signals on the plurality of signal lines such that an eye window of the plurality of data signals is equal to or greater than a reference value.

3. The storage device of claim 2, wherein when the storage device is booted or initialized, the storage controller is configured to:
   transmit training patterns to the at least one semiconductor memory device through the plurality of signal lines;
   perform training to search for skew offsets for minimizing crosstalk occurring among the training patterns on the plurality of signal lines, based on the transmitted training patterns; and
   store the first skew offsets in the first register as the skew information based on a result of the training.

4. The storage device of claim 3, wherein the storage controller is configured to search for the skew offsets by performing the training sequentially on the training patterns on the plurality of signal lines.

5. The storage device of claim 1, wherein the storage controller is configured to transmit skew information including the first skew offsets to the at least one semiconductor memory device by using at least one of a set feature command, a mode register set and a test mode register set, and
   wherein the at least one semiconductor memory device includes a second delay circuit configured to receive the skew information, and configured to delay the plurality of data signals by second skew offsets based on the skew information to cancel the first skew offsets to provide original data signals.

6. The storage device of claim 5, wherein the at least one semiconductor memory device further includes a sampling circuit configured to sample the original data signals based on the data strobe signal.

7. The storage device of claim 1, wherein the at least one semiconductor memory device includes a nonvolatile memory device, and
wherein the storage controller further includes:
a processor configured to control overall operation of the storage controller; and
a nonvolatile memory interface configured to interface with the nonvolatile memory device based on the control of the processor, the nonvolatile memory interface including the first delay circuit and a first register.

8. The storage device of claim 7, wherein:
each of the plurality of data signals has a window defined by a first edge and a second edge;
the at least some edges correspond to a portion of the first edges;
the first register is configured to store the first skew offsets as skew information; and
the first skew offsets correspond to differences of the first edges of the plurality of data signals and the differences of the first edges reduce crosstalk occurring among the plurality of data signals on the plurality of signal lines such that an eye window of the plurality of data signals is equal to or greater than a reference value.

9. The storage device of claim 7, wherein when the storage device is booted or initialized, the storage controller is configured to:
transmit training patterns to the at least one semiconductor memory device through the plurality of signal lines;
perform training to search for skew offsets for minimizing crosstalk occurring among the training patterns on the plurality of signal lines, based on the transmitted training patterns; and
store the first skew offsets in the first register as skew information based on a result of the training.

10. The storage device of claim 9, wherein:
the processor is configured to perform the training during an idle interval of the nonvolatile memory device to update the skew information and is configured to transmit the updated skew information to the nonvolatile memory device.

11. The storage device of claim 7, wherein the first delay circuit includes:
a phase detector configured to detect a phase difference between of each of input data signals input to the first delay circuit and a corresponding one of the plurality of data signals and configured to output an up signal and a down signal based on the phase difference;
a charge pump configured to perform a charging/discharging operation based on the up signal and the down signal to output a control voltage; and
a voltage-controlled delay line (VCDL) configured to adjust a delay amount of the input data signal based on the control voltage to output the corresponding one of the plurality of data signals.

12. The storage device of claim 7, wherein:
the nonvolatile memory interface includes a plurality of transmission latches;
each of the plurality of transmission latches is configured to latch a corresponding one of the plurality of data signals, in synchronization with a corresponding one of delay clock signals generated by delaying a clock signal by the first skew offsets; and
the first delay circuit is configured to delay the clock signal by the first skew offsets based on skew information stored in the first register.

13. The storage device of claim 7, wherein the nonvolatile memory device includes:
a memory cell array including a plurality of memory blocks, each including a plurality of nonvolatile memory cells coupled to word-lines and bit-lines;
a data input/output (I/O) circuit configured to receive the write data to be programmed in the memory cell array through the plurality of signal lines from the storage controller and configured to provide the read data from the memory cell array to the storage controller through the plurality of signal lines; and
a control circuit configured to control the data I/O circuit.

14. The storage device of claim 13, wherein the data I/O circuit includes:
a second register configured to receive skew information and to store the skew information; and
a second delay circuit configured to delay the plurality of data signals by second skew offsets based on the skew information to cancel the first skew offsets to provide original data signals.

15. The storage device of claim 13, wherein at least one of the plurality of memory blocks includes NAND strings including at least a portion of the plurality of nonvolatile memory cells sequentially stacked on a substrate.

16. The storage device of claim 1, wherein the at least one semiconductor memory device includes a volatile memory device having a plurality volatile memory cells coupled to word-lines and bit-lines.

17. The storage device of claim 1, wherein the storage controller and the at least one semiconductor memory device are provided on a printed circuit board (PCB), and
wherein the plurality of signal lines are provided in the PCB and connect the storage controller and the at least one semiconductor memory device.

18. A method of operating a storage device, wherein the storage device includes a storage controller and at least one semiconductor memory device, the storage controller configured to control the at least one semiconductor memory device, the method comprising:
performing, by the storage controller, training to search for first skew offsets for minimizing crosstalk occurring among signal lines while transmitting training patterns to the at least one semiconductor memory device through the signal lines;
storing, by the storage controller, the first skew offsets in a register therein as skew information based on a result of the training;
transmitting, by the storage controller, the skew information to the at least one semiconductor memory device,
delaying, by a first delay circuit of the storage controller, data signals such that at least some first edges of the data signals are desynchronized by the first skew offsets;
transmitting, by the storage controller, the delayed data signals and a data strobe signal to the at least one semiconductor memory device through the signal lines; and
delaying, by a second delay circuit of the at least one semiconductor memory device, the data signals by second skew offsets based on the skew information to cancel the first skew offsets to provide original data signals.

19. The method of claim 18, wherein the storage controller is configured to search for the skew offsets by performing the training sequentially on the training patterns on the signal lines and configured to store the skew information in the register.

20. A storage device comprising:
at least one nonvolatile memory device configured to receive write data based on a data strobe signal and a plurality of data signals, and configured to output read data based on the data strobe signal and the plurality of data signals; and
a storage controller configured to transmit the data strobe signal and the plurality of data signals in parallel to the at least one nonvolatile memory device through a plurality of signal lines,
wherein:
each of the plurality of data signals has a window defined by a first edge and a second edge;
the storage controller includes a first delay circuit configured to delay the plurality of data signals such that at least some edges of the plurality of data signals are desynchronized by first skew offsets which are different from one another;
the storage controller is configured to transmit skew information including the first skew offsets to the at least one nonvolatile memory device; and
the at least one nonvolatile memory device includes a second delay circuit configured to receive the skew information, and configured to delay the plurality of data signals by second skew offsets based on the skew information to cancel the first skew offsets to provide original data signals.

* * * * *